(12) United States Patent
Tredwell et al.

(10) Patent No.: US 7,569,832 B2
(45) Date of Patent: Aug. 4, 2009

(54) DUAL-SCREEN DIGITAL RADIOGRAPHIC IMAGING DETECTOR ARRAY

(75) Inventors: Timothy John Tredwell, Fairport, NY (US); Roger Stanley Kerr, Brockport, NY (US); Robert W. Kulpinski, Penfield, NY (US); John Yorkston, Penfield, NY (US); Timothy John Wojcik, Rochester, NY (US); Kwok-Leung Yip, Webster, NY (US)

(73) Assignee: Carestream Health, Inc., Rochester, NY (US)

( * ) Notice: Subject to any disclaimer, the term of this patent is extended or adjusted under 35 U.S.C. 154(b) by 0 days.

(21) Appl. No.: 12/102,154

(22) Filed: Apr. 14, 2008

(65) Prior Publication Data

US 2008/0245968 A1 Oct. 9, 2008

Related U.S. Application Data

(63) Continuation-in-part of application No. 11/487,539, filed on Jul. 14, 2006.

(51) Int. Cl.
*G01T 1/20* (2006.01)
(52) U.S. Cl. .................................. 250/370.11
(58) Field of Classification Search ........... 250/370.01–370.15; 378/98.8
See application file for complete search history.

(56) References Cited

U.S. PATENT DOCUMENTS

| 4,399,209 A | 8/1983 | Sanders et al. |
| 4,416,966 A | 11/1983 | Sanders et al. |
| 4,440,846 A | 4/1984 | Sanders et al. |
| 4,621,271 A | 11/1986 | Brownstein |
| 4,772,582 A | 9/1988 | DeBoer |
| 4,973,572 A | 11/1990 | DeBoer |
| 5,138,167 A * | 8/1992 | Barnes ............... 250/370.01 |
| 5,578,416 A | 11/1996 | Tutt |
| 5,793,047 A * | 8/1998 | Kobayashi et al. ..... 250/370.09 |
| 5,907,767 A * | 5/1999 | Tohyama .................. 438/75 |
| 2005/0017189 A1* | 1/2005 | Homma et al. ......... 250/370.11 |
| 2006/0067472 A1* | 3/2006 | Possin et al. ............. 378/98.9 |
| 2006/0151708 A1* | 7/2006 | Bani-Hashemi et al. ............... 250/370.11 |

FOREIGN PATENT DOCUMENTS

JP 06036715 A * 2/1994

OTHER PUBLICATIONS

Seibert et al., "Dual energy radiography using active detector technology,", 1997, IEEE, Nuclear Science Symposium, 1996, Conference Record, vol. 2, pp. 1244-1247.*

Antonuk et al., "Thin-film, Flat-panel, composite imagers for projection and tomographic imaging,", 1994, IEEE Transactions on Medical Imaging, vol. 13, No. 3, pp. 482-490.*

(Continued)

*Primary Examiner*—David P Porta
*Assistant Examiner*—Kiho Kim

(57) ABSTRACT

A radiographic imaging device has a first scintillating phosphor screen having a first thickness and a second scintillating phosphor screen having a second thickness. A transparent substrate is disposed between the first and second screens. An imaging array formed on a side of the substrate includes multiple photosensors and an array of readout elements.

26 Claims, 17 Drawing Sheets

OTHER PUBLICATIONS

Commonly assigned: U.S. Appl. No. 11/487,539, filed Jul. 14, 2006 by Yorkston et al., entitled Apparatus for Asymmetric Dual-Screen Digital Radiography.

Commonly assigned: U.S. Appl. No. 12/025,086, filed Feb. 4, 2008 by Tredwell entitled Digital Radiographic Imaging Apparatus.

Commonly assigned: U.S. Appl. No. 11/951,483, filed Dec. 6, 2007 by VanMetter et al. entitled Cardiac Gating for Dual-Energy Imaging.

Commonly assigned: U.S. Appl. No. 60/889,356, filed Feb. 6, 2007 by VanMetter entitled Dual Energy Decomposition Renormalization.

Commonly assigned: U.S. Appl. No. 60/896,322, filed Mar. 22, 2007 by Dhanantwari et al. entitled Registration Method for Projections in Dual Energy.

Aln Stevels et al., "Vapor Deposited CsI:Na Layers: Screens for Application in X-Ray Imaging Devices," Philips Research Reports 29:353-362 (1974).

T. Jing et al, "Enhanced Columnar Structure in CsI Layer by Substrate Patterning", IEEE Trans. Nucl. Sci. 39: 1195-1198 (1992).

* cited by examiner

DUAL-SCREEN DIGITAL RADIOGRAPHIC IMAGING DETECTOR ARRAY

CROSS REFERENCE TO RELATED APPLICATION

This application is a continuation-in-part of co-pending, commonly assigned U.S. patent application Ser. No. 11/487,539 filed Jul. 14, 2006 by Yorkston, et al, entitled APPARATUS FOR ASYMMETRIC DUAL-SCREEN DIGITAL RADIOGRAPHY.

FIELD OF THE INVENTION

The invention relates generally to digital radiography, and in particular relates to the use of dual, asymmetric phosphor screens in a digital radiographic flat-panel imaging detector array to improve image quality.

BACKGROUND OF THE INVENTION

Generally, medical X-ray detectors employing a scintillating phosphor screen to absorb X-rays and produce light suffer the loss of spatial resolution due to lateral light diffusion in the phosphor screen. To reduce lateral light diffusion and maintain acceptable spatial resolution, the phosphor screens must be made sufficiently thin. The spatial resolution and X-ray detection ability of an imaging apparatus are often characterized by the modulation transfer function (MTF) and X-ray absorption efficiency, respectively. Thin phosphor screens produce better MTF at the expense of reduced X-ray absorption. Usually, the coating density and the thickness of the phosphor screen are used in the design tradeoff between spatial resolution and X-ray absorption efficiency.

In order to improve X-ray absorption and maintain spatial resolution, the use of dual screens is known in conjunction with digital computed radiography (CR) to improve the X-ray absorption efficiency. In such CR apparatuses, a storage phosphor screen is used in place of the prompt emitting phosphor screen employed in traditional screen-film apparatus. No film is needed for CR. Upon X-ray exposure, the storage phosphor screen stores a latent image in the form of trapped charge that is subsequently read out, typically by a scanning laser beam, to produce a digital radiographic image.

Recently, digital flat panel imaging detector arrays based upon active matrix thin film electronics have shown promise for applications such as diagnostic radiology and digital mammography. There are two types of X-ray energy conversion methods used in digital radiography (DR), namely: the direct method and the indirect method. In the direct method, the X-rays absorbed in a photoconductor are directly transduced into a charge signal, stored on the pixel electrodes on an active matrix array (AMA) and read out using thin film transistors (TFTs) to produce a digital image. Amorphous selenium (a-Se) is typically used as the photoconductor. No phosphor screen is required for the direct method. In the indirect method, a phosphor screen is used to absorb X-rays and the light photons emitted by the phosphor screen are detected by an AMA with a single photodiode (PD) and a TFT switch at each pixel. The photodiode absorbs the light given off by the phosphor in proportion to the X-ray energy absorbed. The stored charge is then read out, like the direct method, using the TFT switch. Several types of imaging arrays based on thin-film-transistors can be used for image sensing. These include hydrogenated amorphous-silicon (a-Si:H) photodetectors with amorphous-silicon TFT switches, amorphous silicon photodetectors with low-temperature-polysilicon (LTPS), and organic photodetectors with organic TFT (OTFT) switches.

FIG. 1 shows a block diagram of circuitry for a typical type of known flat panel imager 10, which includes a sensor array 12. The a-Si based sensor array includes m data lines 14 and n row select or gate lines 16. Each pixel comprises an a-Si photodiode 18 connected to a TFT 20. Each photodiode 18 is connected to a common bias line 22 and a drain 24 of its associated TFT. Gate lines 16 are connected to gate drivers 26. Bias lines 22 carry bias voltages applied to photodiodes 18 and TFTs 20. TFTs 20 are controlled by their associated gate lines 26 and when addressed, transfer stored charge onto data lines 14. During readout, a gate line is turned on for a finite time (approximately 10 to 100 μs), allowing sufficient time for TFTs 20 on that row to transfer their pixel charges to all the m data lines. Data lines 14 are connected to charge amplifiers 28, which operate in parallel. In general, charge amplifiers 28 are divided into a number of groups, with each group typically having 32, 64, or 128 charge amplifiers. The associated charge amplifiers in each group detect the image signals, and clock the signals onto multiplexer 30, whence they are multiplexed and subsequently digitized by an analog to digital converter 32. The digital image data are then transferred over a coupling to memory. In some designs, a correlated double sampling (CDS) circuit 34 may be disposed between each charge amplifier 28 and multiplexer 30 to reduce electronic noise. Gate lines 16 are turned on in sequence, requiring approximately a few seconds for an entire frame to be scanned. Additional image correction and image processing are performed by a computer 36 and the resulting image is displayed on a monitor 38 or printed by a printer 40.

FIG. 2 shows a cross-section (not to scale) of a single, typical type of known imaging pixel 50 such as is used in conventional a-Si based flat panel imagers in which the image sensing element is a PIN photodiode. Each imaging pixel 50 has a PIN photodiode 52 and a TFT switch 54 formed on a substrate 56. A layer of X-ray converter (e.g., a scintillating phosphor screen 58) is coupled to the photodiode-TFT array. TFT switch 54 comprises the following layers: a first layer of metal 60 forming a TFT gate electrode and row select lines, an insulator layer 62 forming a gate dielectric for the TFT, an intrinsic amorphous silicon layer 64 forming a channel region for the TFT, amorphous silicon making up an n-type dopant layer 66 forming the source and the drain for the TFT, a second layer of metal 68 forming TFT source and drain contacts and data lines, and an insulator layer 70. PIN photodiode 52 includes the following layers: a third layer of metal 72 forming a back contact of the PIN photodiode and an interconnect between the TFT and the PIN photodiode, an amorphous silicon film 74 containing a p-type dopant, an intrinsic amorphous silicon film 76, an amorphous silicon film 78 containing a p-type dopant, a transparent contact electrode 80 such as indium-tin oxide, an insulator layer 81, and a fourth layer of metal 82 forming a topside contact of the PIN photodiode. An X-ray photon path 84 and visible light photon paths 86 are also shown in FIG. 2. When a single X-ray is absorbed by the screen 58, a large number of light photons are emitted isotropically. Only a fraction of the emitted light reaches the photodiode and is detected. The operation of such an a-Si based pixel with a-Si PIN electrodes is understood by those skilled in the art.

FIG. 3 shows a cross-section of two adjacent pixels 90 of another type of known image sensor array 92. In this architecture a photodiode 94 is vertically integrated above a TFT switch 96 instead of the side-by-side arrangement shown in FIG. 2. The vertically integrated sensor array is comprised of a substrate 98, a first layer of metal 100 forming the gate electrode of the TFT and the row select lines, an insulator layer 102 forming the gate dielectric of the TFT, an intrinsic (that is, not doped) amorphous silicon layer 104 forming the channel of the TFT, an n-doped amorphous silicon film 106 forming source and drain regions of the TFT and a second layer of metal 108 patterned to form source and drain contacts and the data lines. An insulator layer 110 is used to separate a TFT plane 112 from a PIN photodiode plane 114. The PIN photodiode comprises a third layer of metal 116 forming a back contact electrode, sequential deposition of an n-doped layer 118, an intrinsic amorphous silicon layer 120 and a p-doped layer 122 of amorphous silicon, followed by a transparent contact electrode 124. The photodiode layers are patterned to form individual photosensitive elements. An insulating layer 126, and a fifth layer of metal 128 forming a bias line complete the pixel. The vertically-integrated configuration offers improved photosensitivity as compared to the side-by-side configuration, due to a higher fraction of photosensitive area to pixel area (termed fill-factor).

FIG. 4 shows a cross-section (not to scale) of yet another type of known imaging pixel 140 in a prior art a-Si based flat panel imager in which the image sensing element is a metal-insulating-semiconductor (MIS) photosensor 142. Each imaging pixel 140 includes MIS photosensor 142 and a TFT switch 144 formed on a substrate 146. TFT switch 144 includes the following layers: a first layer of metal 148 forming TFT gate electrode and row select lines, an insulator layer 150 forming a gate dielectric for the TFT, an intrinsic amorphous silicon layer 152 forming a channel region for the TFT, amorphous silicon containing an n-type dopant layer 154 forming the source and drain for the TFT, an insulator layer 156 and a second layer of metal 158 forming TFT source and drain contacts and data lines. MIS photodiode 142 includes the following layers: first layer of metal 148 forming the gate electrode for the MIS photosensor, insulator layer 150 forming the gate dielectric, amorphous silicon film layer 152 forming the channel region, amorphous silicon film 154 forming the drain, a transparent electrode 160 in contact with n-type layer 154, insulator layer 156 and second layer of metal 158 forming a topside contact. The operation of such an a-Si based indirect flat panel imager with MIS photo-sensors is known to those skilled in the art.

It will be recognized by those skilled in the art that other types of photosensors, such as continuous PIN photodiodes, continuous MIS photosensors, phototransistors, and photoconductors can be realized in a variety of materials, including amorphous, polycrystalline or single-crystal silicon and non-silicon semiconductors. It will also be recognized by those skilled in the art that other pixel circuits, such as three-transistor active pixel, four-transistor active pixel and shared transistor active pixel circuits, can be used to form a radiographic imaging array.

It will be recognized by those skilled in the art that many other architectures for readout arrays are commonly used. It will also be recognized by those skilled in the art that semiconductor materials other than amorphous silicon, such as polycrystalline silicon, organic semiconductors, and various alloy semiconductors such as zinc oxide can be used for the backplane array and the sensing array. Recently, thin film transistor arrays have been fabricated on flexible substrates (made of plastics, metal foils, or other suitable organic and inorganic materials) rather than on the conventional non-flexible and brittle glass substrate. The TFT arrays on flexible substrates have been combined with liquid crystals for flexible transmissive and reflective displays, with organic light emitting devices for emissive displays, and with photosensors for visible light imaging and radiographic imaging applications.

Reference is made to commonly assigned, copending U.S. patent applications (a) Ser. No. 11/951,483 filed Dec. 6, 2007 by VanMetter et al. entitled CARDIAC GATING FOR DUAL-ENERGY IMAGING; (b) Ser. No. 60/889,356 filed Feb. 6, 2007 by VanMetter entitled DUAL ENERGY DECOMPOSITION RENORMALIZATION; and (c) Ser. No. 60/896,322 filed Mar. 22, 2007 by Dhanantwari et al. entitled REGISTRATION METHOD FOR PROJECTIONS IN DUAL ENERGY. These applications concern inventions regarding another imaging technique, known as dual energy subtraction imaging, that can be used to reduce the impact of anatomic background on disease detection in digital chest radiography and angiography. This technique is based on the different energy-dependent absorption characteristics of bone and soft tissue. In general, two raw digital images are produced. One is a low-energy and high-contrast image, and the other is a high-energy and low-contrast image. By taking nonlinear combinations of these two images, pure bone and soft-tissue images can be obtained. This imaging technique would improve diagnosis of pathology and delineation of anatomy using images.

In U.S. patent application Ser. No. 11/487,539, several dual digital radiography arrays, each imaging a respective phosphor screen, are disclosed. In one embodiment X-rays are directed through an object to a digital radiography imager to form an image. The digital radiography imager uses two flat panels (a front panel and a back panel) to capture and process X-rays in order to form an image. Preferably, the thickness of the scintillating phosphor layer of the back panel is greater than or equal to the thickness of the scintillating phosphor layer of the front panel. A filter is placed between the front panel and the back panel to minimize the crossover of light emitted in one panel to the other panel. Each panel has a first array of signal sensing elements and readout devices and a second array of signal sensing elements and readout devices. In addition, a first passivation layer is disposed on the first array of signal sensing elements and readout devices, and a second passivation layer is disposed on the second array of signal sensing elements and readout devices. The front panel and back panel are exposed to X-rays simultaneously. The first scintillating phosphor layer is responsive to X-rays passing through the object and produces light which illuminates the signal sensing elements of the first array of signal sensing elements and readout devices to provide signals representing a first X-ray image. The second scintillating phosphor layer is responsive to X-rays passing through the object and the front panel to produce light which illuminates the signal elements of the second array of signal sensing elements and readout devices to provide signals representing a second X-ray image. The signals of the first and second X-ray images can be combined to produce a composite X-ray image of a higher quality.

In another embodiment disclosed in U.S. patent application Ser. No. 11/487,539, separate flat-panel imagers are fabricated on each of the two sides of a substrate to form a digital radiographic imaging array. The first imager is primarily sensitive to the light from a first phosphor screen, which is placed in proximity to the first imager. The second imager is primarily sensitive to the light emitted from a second phosphor screen, which is placed in proximity to the second imager. Instead of using two front and back panels to capture the radiographic images, the digital radiography imager uses a single substrate having a first phosphor layer coated on the front side of the substrate and a second phosphor layer coated on the back side of the substrate. In one aspect of this embodiment, the second scintillating phosphor layer can have a thickness which is greater than or equal to the thickness of first scintillating phosphor layer. An NIP photodiode is used on each side of the substrate. A light blocking layer or crossover reducing layer is coated on each side of the substrate to minimize the crossover of light emitted in phosphor screen on one side of the substrate to the photodiode on the other side of the substrate. The first and second scintillating phosphor layers are exposed to X-rays simultaneously and the photodiode on the front and back sides of substrate detect the front and back image respectively.

A need has existed for extending the application of dual scintillating screens (scintillating phosphor layers) to an indirect digital radiography (DR) apparatus. Moreover, there exists a need for extending the application of dual scintillating screens in an indirect DR apparatus for single-exposure dual energy subtraction imaging.

SUMMARY OF THE INVENTION

An object of the invention is to provide an improved dual-screen digital radiographic imaging device.

An advantage of the invention is that it allows DR imaging to combine a first image optimized for Modulation Transfer Function (MTF) with a second image optimized for sensitivity in order to obtain an x-ray image with higher quality in a DR imaging system.

In one embodiment of the invention, a radiographic imaging device comprises a first scintillating phosphor screen having a first thickness; a second scintillating phosphor screen having a second thickness; a substrate disposed between the first and second screens, the substrate being substantially transparent to X-rays used with the device; and an imaging array disposed between a first side of the substrate and one of the first and second screens, the imaging array comprising a plurality of pixels, each pixel including at least one photosensor and at least one readout element. The readout element may be a thin-film transistor formed on one side of the substrate. As used in this specification, "substantially transparent" means that X-rays pass through the substrate in an ample or considerable amount sufficient for detection by the photosensor to produce a radiographic image.

In another embodiment, a radiographic imaging device comprises a substrate substantially transparent to X-rays used with the device; a first scintillating phosphor screen having a first thickness disposed on a first side of the substrate; a second scintillating phosphor screen having a second thickness disposed on a second side of the substrate, so that the substrate is between the first and second scintillating phosphor screens; the substrate being transparent to light emitted from the first and second screens; and an imaging array formed on one side of the substrate, the imaging array comprising a first group of photosensors primarily sensitive to light emitted from the first screen; and a second group of photosensors primarily sensitive to light emitted from the second screen.

The asymmetric dual-screen digital radiography apparatus of the present invention has various advantages over a single-screen digital radiography apparatus. The higher spatial frequency response, or MTF of the apparatus of the present invention yields sharper images. The higher X-ray absorption yields higher detector speed. The lower noise levels of the exemplary apparatus of the present invention give less quantum mottle. The higher detective quantum efficiency (DQE) of the embodiments of the present invention provides higher overall image quality. Furthermore, the use of a pair of asymmetric screens in an indirect DR apparatus significantly eases the conflict in the design of an X-ray phosphor screen to simultaneously maintain both a good level of X-ray absorption (which in general requires a screen with increased thickness) and high spatial resolution (which in general requires a screen with decreased thickness). Moreover, the use of a flexible substrate (e.g., metal foil, plastic sheet, or combinations thereof) for the flat panel imaging apparatus improves the mechanical strength and physical durability of the apparatus, and reduces the X-ray absorption loss due to the substrate.

In all of the above-identified embodiments of the invention, a single imaging array is used to sense both screens. Within each pixel, one or more photodiodes are used to image the first screen and one or more photodiodes are used to image the second screen. The use of a single readout array guarantees precise registration of the images of the two screens, provides a thinner and more robust panel assembly than the use of multiple panels, and requires less support electronics, in particular fewer row drivers and column amplifiers and digitizers.

These and other objects, features, and advantages of the present invention will become apparent to those skilled in the art upon a reading of the following detailed description when taken in conjunction with the drawings in which there are shown and described several illustrative embodiments of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings.

DETAILED DESCRIPTION OF THE INVENTION

Reference is made to commonly assigned, copending U.S. patent application Ser. No. 12/025,086 filed Feb. 4, 2008 by Tredwell entitled DIGITAL RADIOGRAPHIC IMAGING APPARATUS.

The present description is directed in particular to elements forming part of, or cooperating more directly with, apparatuses in accordance with the invention. It is to be understood that elements not specifically shown or described may take various forms well known to those skilled in the art. In the description that follows, terms and phrases such as "above" or "on top of" are used in a broad sense, to indicate an arrangement of layers relative to each other. Certainly, an X-ray imaging plate may be exposed in any orientation, where stacked layers extend in generally horizontal, vertical, or oblique directions.

Figure 1:
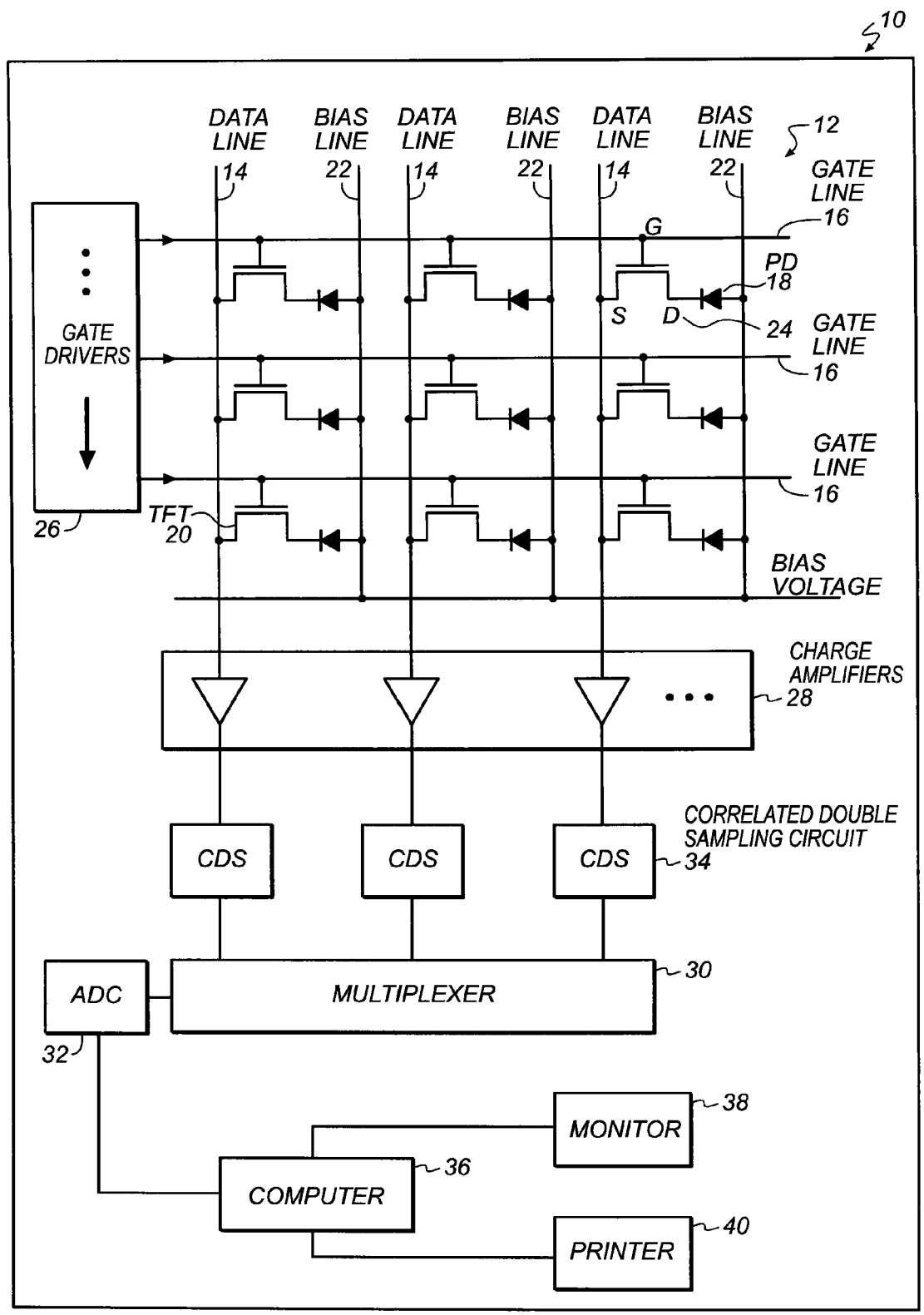
FIG. 1 is a schematic diagram of a conventional imaging panel used in a flat-panel imager.
Figure 2:
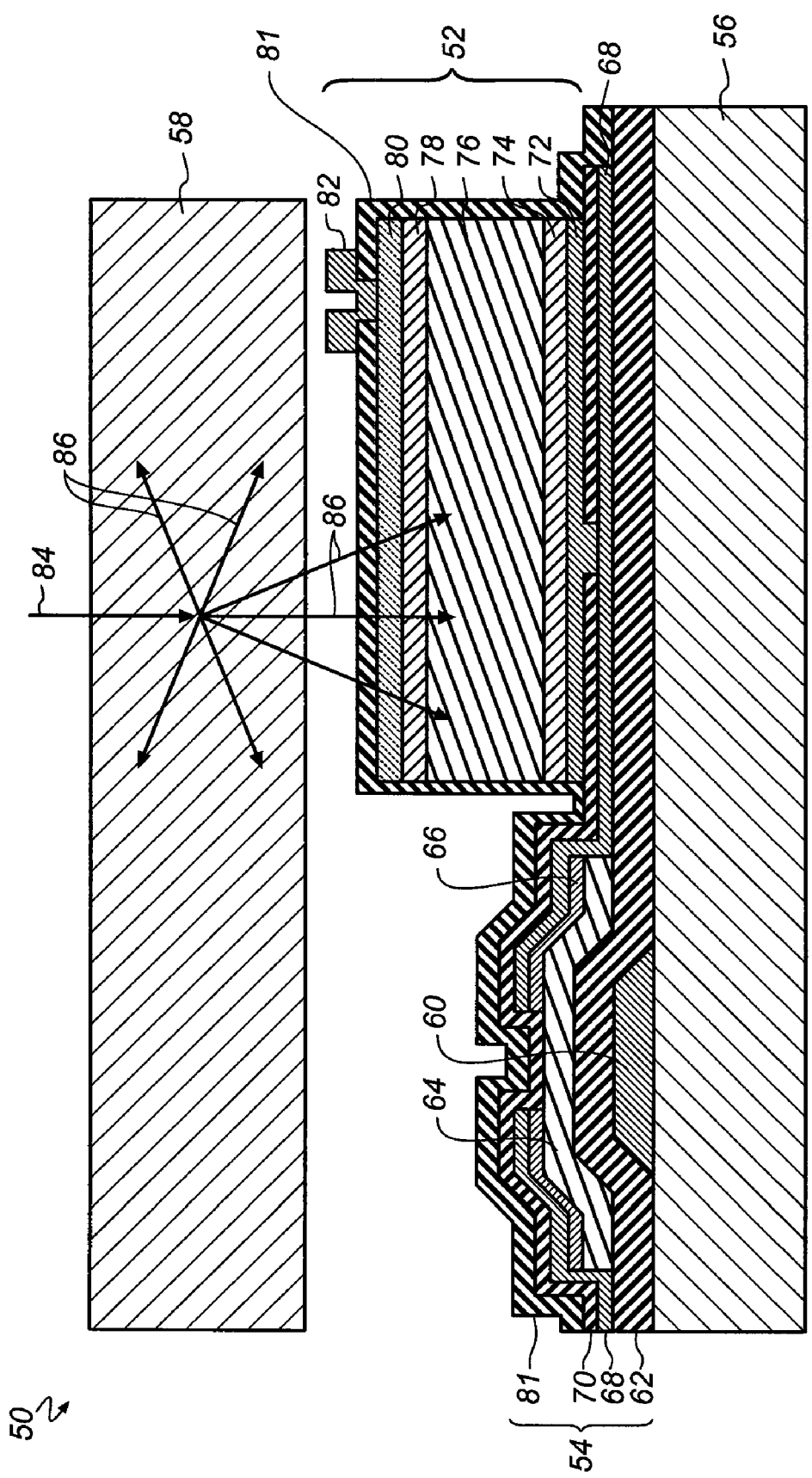
FIG. 2 is a cross-sectional view of one known type of imaging pixel incorporating PIN photodiodes.
Figure 3:
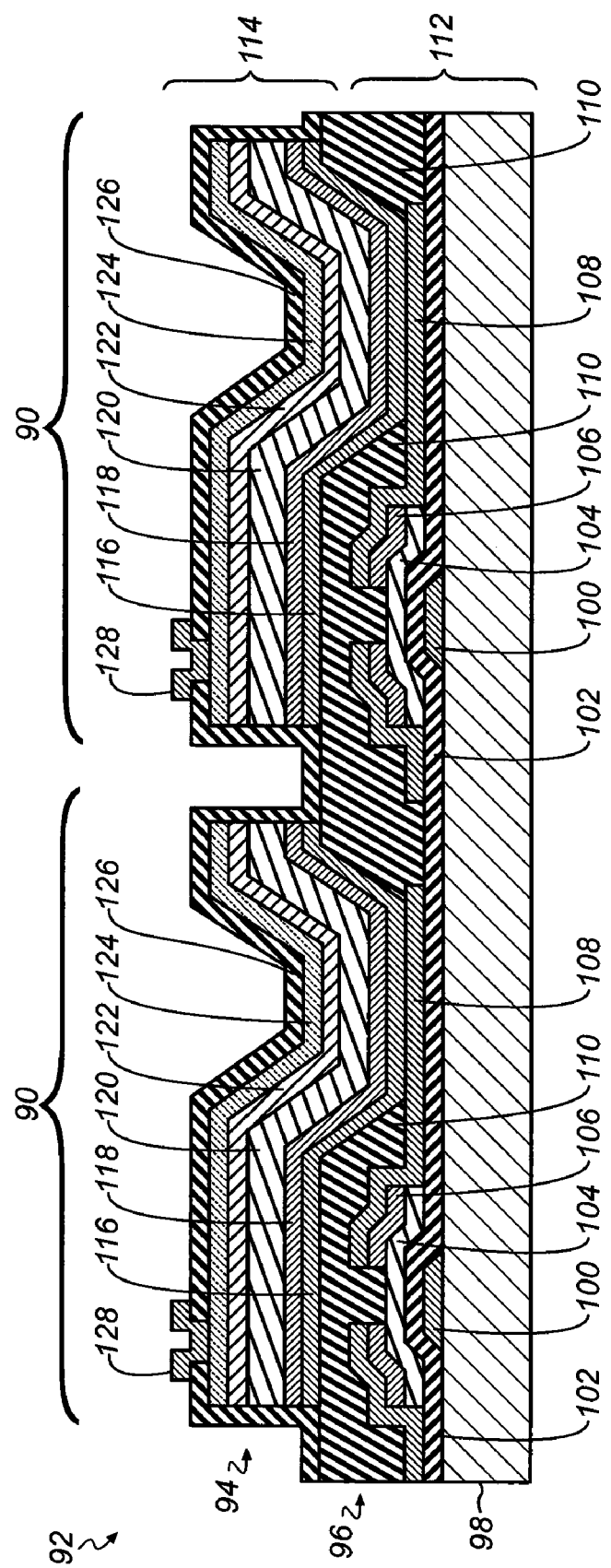
FIG. 3 is a cross-sectional view of another type of known imaging pixel in which the PIN photodiode is vertically integrated above a TFT switch.
Figure 4:
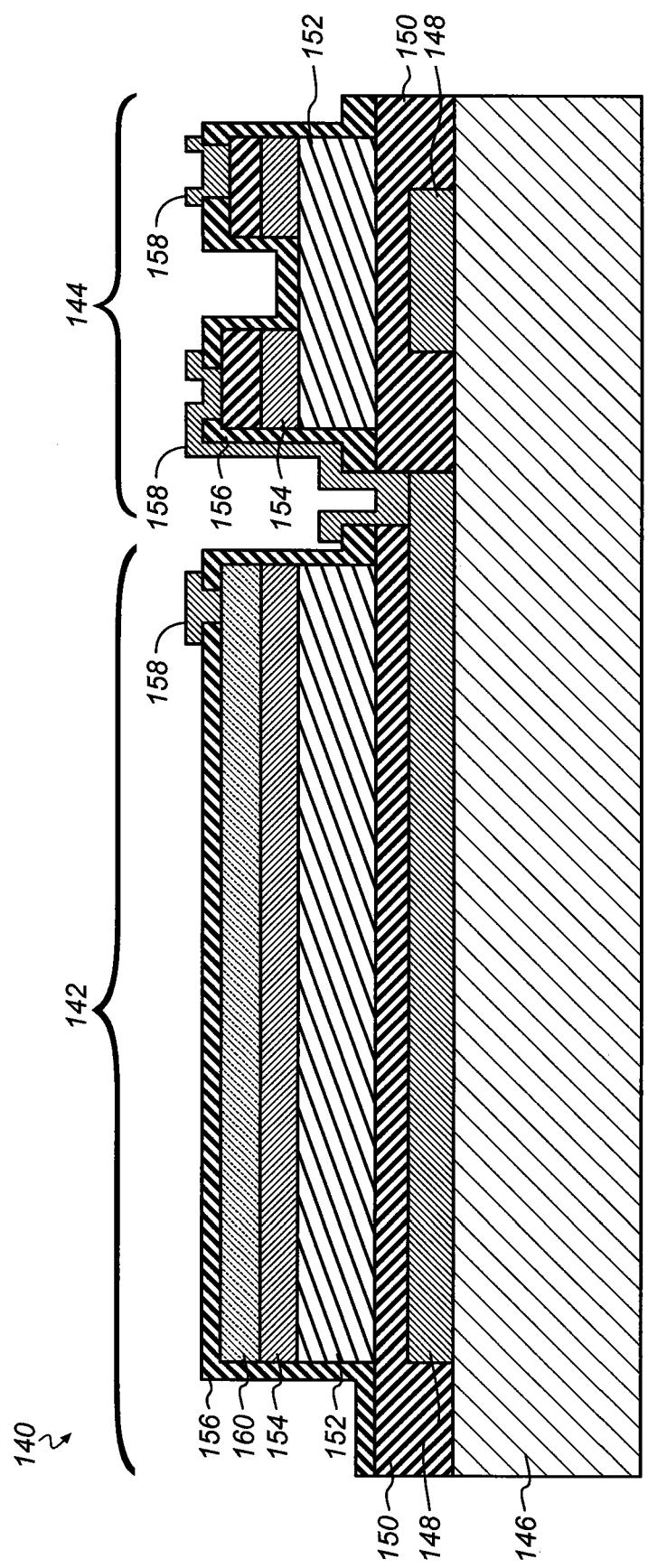
FIG. 4 is a cross-sectional view of another type of known imaging pixel in which an MIS photosensor is formed in a planar, side-by-side arrangement with a TFT switch.
Figure 5:
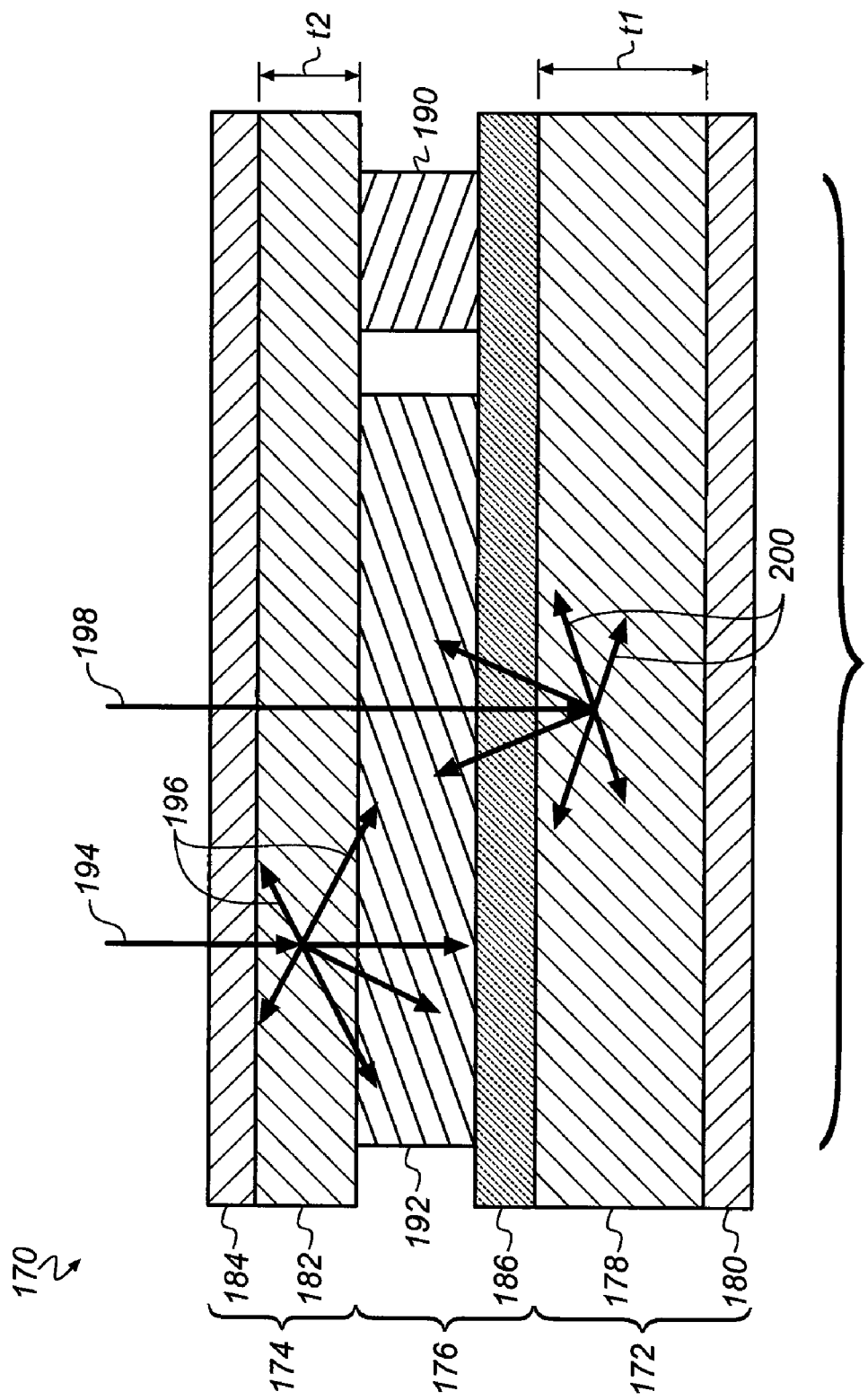
FIG. 5 is a schematic cross-sectional view of one embodiment of an imaging pixel in accordance with the invention.

FIGS. 5 to 17 show diagrammatic views of various digital imaging devices in accordance with the present invention. A schematic cross-section of a first exemplary embodiment of the invention is illustrated in FIG. 5. A radiographic imaging device 170 comprises a first scintillating phosphor screen assembly 172, a second scintillating phosphor screen assembly 174, and an imaging array 176. First scintillating phosphor screen assembly 172 includes a first scintillator 178 of thickness t1 and a light control coating 180 and is arranged on a first side of imaging array 176. Second scintillating phosphor screen assembly 174 includes a second scintillator 182 of a thickness t2 and a light control coating or layer 184 and is arranged on a second side of the imaging array 176. The light control coating or layer may be either light-absorptive or light-reflective depending on the optimization of the function of the screen. A light-absorptive layer would optimize for high spatial resolution at the expense of sensitivity by absorbing light which otherwise might scatter to adjacent pixels. Conversely, a light-reflective layer would optimize for high sensitivity at the expense of spatial resolution. Imaging array 176 comprises a thin, transparent substrate 186 on which pixels 188 are formed, each pixel comprising readout elements 190 (such as TFTs, for example) and photosensors 192.

In this embodiment, photosensors 192 are sensitive to light from both scintillating phosphor screen assemblies 172, 174. Following absorption of an X-ray 194 in the second phosphor screen assembly 174 and subsequent emission of light 196, a portion of the emitted light 196 is absorbed in the photosensor 192. Similarly, following absorption of an X-ray 198 in phosphor screen 172 and subsequent emission of light 200, a portion of the emitted light 200 is absorbed in the photosensor 192. As is well known, the absorption of light in the photosensor produces electron-hole pairs, termed photo-generated charge, which can be stored on the photosensor and later read-out through the readout elements 190. This first embodiment does not discriminate between the top and bottom screen. Sandwiching the detector between two screens allows for higher overall sensitivity and resolution as compared to a single thick screen.

Photosensors 192 can be any of a number of types of devices. For example, in one embodiment, photosensors 192 are metal-insulating-semiconductor (MIS) photodiodes, photoconductors or photo-transistors. Readout elements 190 can also be formed of any of a number of types of devices. For example, readout elements 190 could be formed of any of amorphous silicon thin-film-transistors, polysilicon thin-film-transistors, organic thin-film-transistors, or crystalline silicon thin-film-transistors. Transparent substrate 186 could alternatively be a plastic, a glass, a ceramic, or a multi-layer film containing organic and/or inorganic layers, such as a plastic coated with a thin film of silicon nitride.

Figure 6:
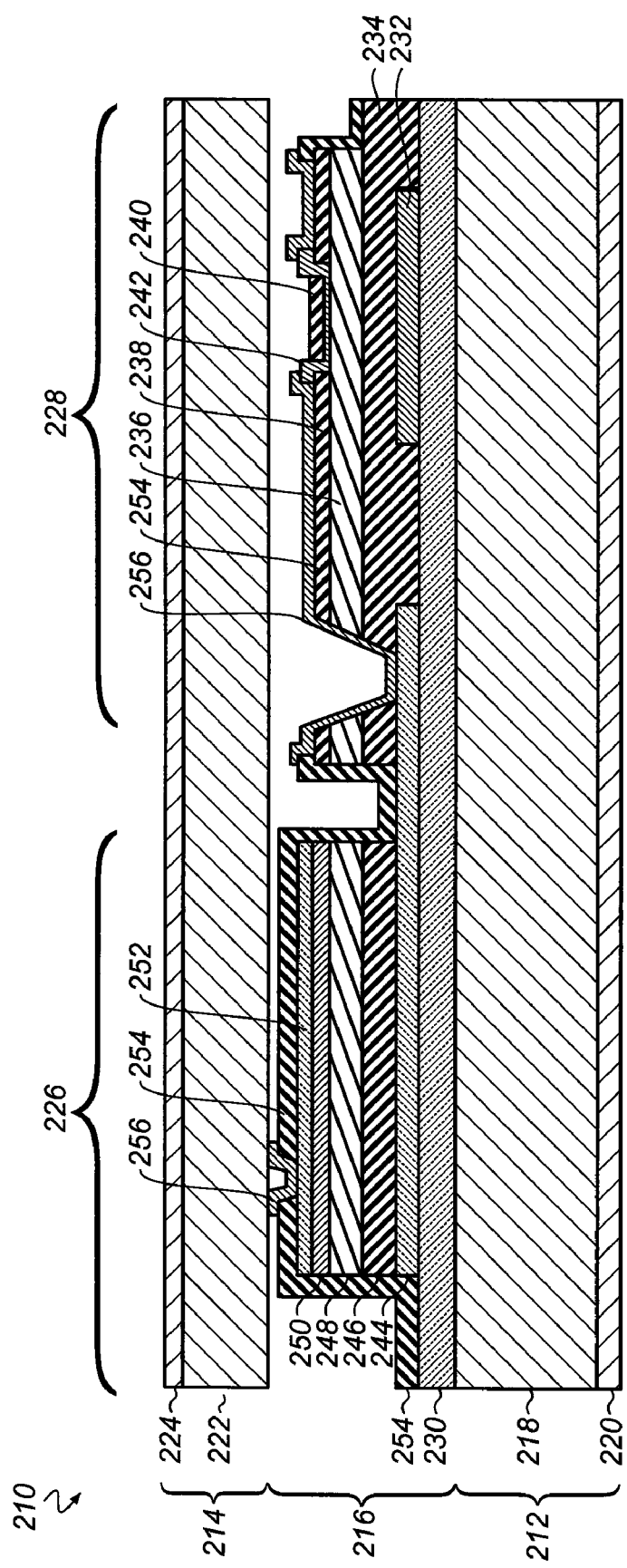
FIG. 6 shows a detailed cross-sectional view of the inventive imaging pixel of FIG. 5.

FIG. 6 shows a detailed cross-section of a particular embodiment of the radiographic imaging array of FIG. 5 in which the photosensor is an amorphous silicon MIS photodiode and the read-out element is an amorphous silicon TFT. In FIG. 6, a radiographic imaging device 210 includes a first scintillating phosphor screen assembly 212, a second scintillating phosphor screen assembly 214 and an imaging array 216. First scintillating phosphor screen assembly 212 includes a first scintillating phosphor 218 and a first light-absorbing layer 220. Second scintillating phosphor screen assembly 214 includes a second scintillating phosphor 222 and a second light-absorbing layer 224. Imaging array 216 includes an MIS photosensor 226 and a TFT readout-element 228 formed on a thin, transparent substrate 230. TFT 228 comprises a first layer of metal 232 forming the gate electrode and also forming gate lines for row-address, an insulator layer 234 forming a gate dielectric, an intrinsic amorphous silicon layer 236 forming the TFT channel, an amorphous silicon layer 238 with n-type dopant forming source and drain regions, an insulating layer 240 and a fourth layer of metal 242 forming contact to the source and drain and interconnect to the photosensor. Photosensor 226 comprises a second layer of metal 244 that is transparent to the light emitted by first phosphor screen assembly 212, an insulator layer 246 forming the gate dielectric, an intrinsic amorphous silicon layer 248 forming the channel region, an n-doped amorphous silicon layer 250 forming the drain region, a third layer of metal 252 forming a transparent electrode contact to the n-doped region, an insulator layer 254 and a fourth layer of metal 256 contacting the transparent electrode 252 and forming the bias line. Examples of transparent metals include indium tin oxide (ITO), zinc oxide (ZO) and indium zinc oxide (IZO). TFT 228 typically is light-shielded from the phosphor screens by employing opaque metals, such as Al, Al:Nd, Cr, Mo or multilayer films for first and second metal layers 232, 244. These light-shielding layers can also be realized using metals which have high light reflectance in order to increase collection efficiency.

Figure 7:
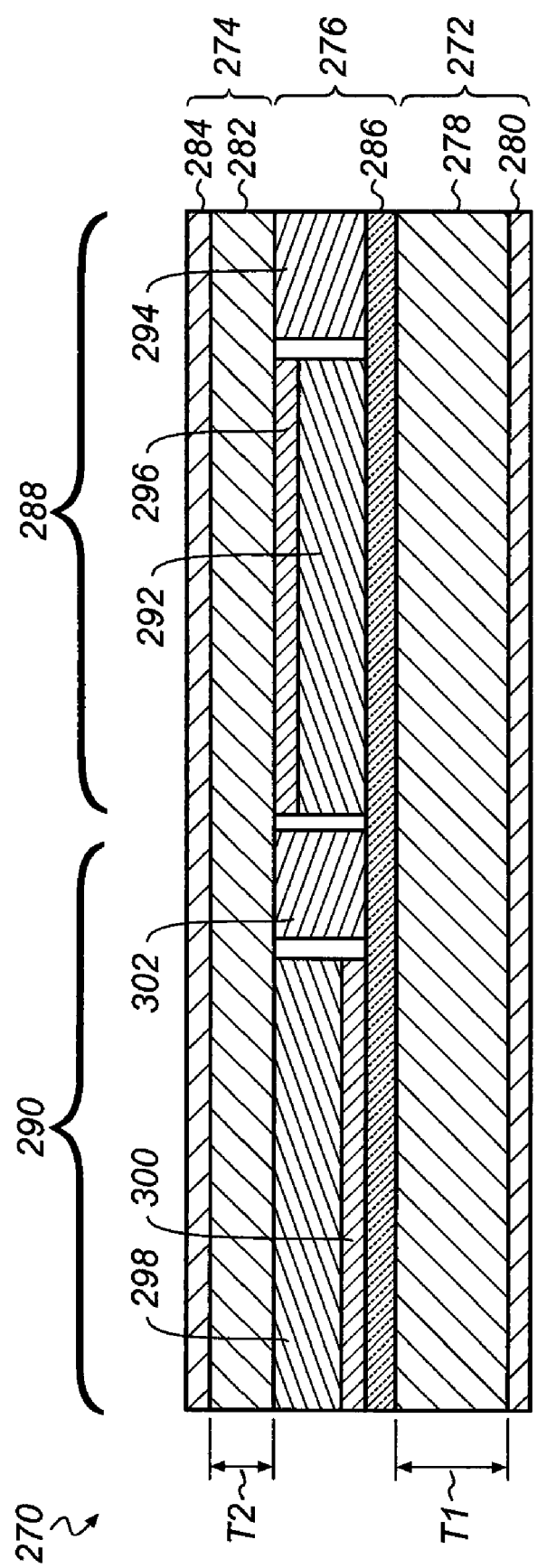
FIG. 7 shows a schematic cross-sectional view of another embodiment of an imaging pixel in accordance with the invention, in which some of the photosensors are sensitive to light from one side of the assembly and other photosensors are sensitive to light from the other side of the assembly.

A schematic cross-section of a second exemplary embodiment of the invention is shown in FIG. 7. In this embodiment a portion of the photodiodes are sensitive to light emitted from a first scintillating phosphor screen and another portion of the photodiodes are sensitive to light emitted from a second scintillating phosphor screen. As illustrated in FIG. 7, a radiographic imaging device 270 includes a first scintillating phosphor screen assembly 272, a second scintillating phosphor screen assembly 274, and an imaging array 276. First phosphor screen assembly 272 comprises a scintillating phosphor screen 278 of a first thickness T1 and a first light-absorptive or light-reflective layer 280. Second phosphor screen assembly 274 includes a second scintillating phosphor screen 282 of thickness T2 and a second light absorptive or light-reflective layer 284. A light-absorptive layer may be used to improve spatial resolution (MTF) by absorbing light scattered within the phosphor, thus preventing the light from being scattered into a neighboring imaging element, at the expense of overall light collection efficiency. A light-reflective layer may be used to improve overall light collection efficiency at the expense of spatial resolution. If first phosphor screen assembly 272 of FIG. 7 were being optimized for high signal-to-noise ratio (SNR) and second phosphor screen assembly 274 were being optimized for high spatial resolution, thickness T1 would be larger than thickness T2; and the first light absorptive or light-reflective layer 280 would be only light-reflective and the second light absorptive or light-reflective layer 284 would be only light-absorptive. It will be recognized by those skilled in the art that the first and second phosphor screens may also be optimized for particular imaging characteristics, such as conversion efficiency and MTF, by optimization of parameters other than thickness, such as the materials selection and materials structure of the screens.

Continuing with regard to FIG. 7, imaging array 276 comprises a thin, transparent substrate 286, a first photo-sensing element 288 primarily sensitive to light emitted from the first phosphor screen 278 and a second photo-sensing element 290 primarily sensitive to light emitted from second phosphor screen 282. First photosensitive element 288 includes a first light-sensitive element 292, a first readout element 294 and a first light-blocking layer 296 arranged so as to reduce light transmission from second phosphor screen 282 to first light-sensitive element 292. Similarly, second photosensitive element 290 includes a second light-sensitive element 298, a second light-blocking layer 300 and a second readout element 302. Examples of first and second light-sensitive elements 292, 298 include PIN photodiodes, MIS photosensors, phototransistors, photoconductors, vertical and lateral p-n junction photodiodes, photo-capacitors, pinned photodiodes, and avalanche photodiodes. Light-sensitive elements 292, 298 may be realized in inorganic semiconductors in amorphous, polycrystalline or crystalline form, such as amorphous silicon, poly-crystalline silicon, and crystalline silicon, Light-sensitive elements 292, 298 may also be realized in organic semiconductors or organic/inorganic combinations. Examples of readout elements 294, 302 well known to those skilled in the art include a 1-transistor passive pixel circuit, a 2-transistor passive pixel circuit, a 3-transistor active pixel circuit, a 4-transistor active pixel circuit, a shared-transistor active pixel circuit, a photon-counting pixel circuit, and a charge-coupled device.

Figure 8:
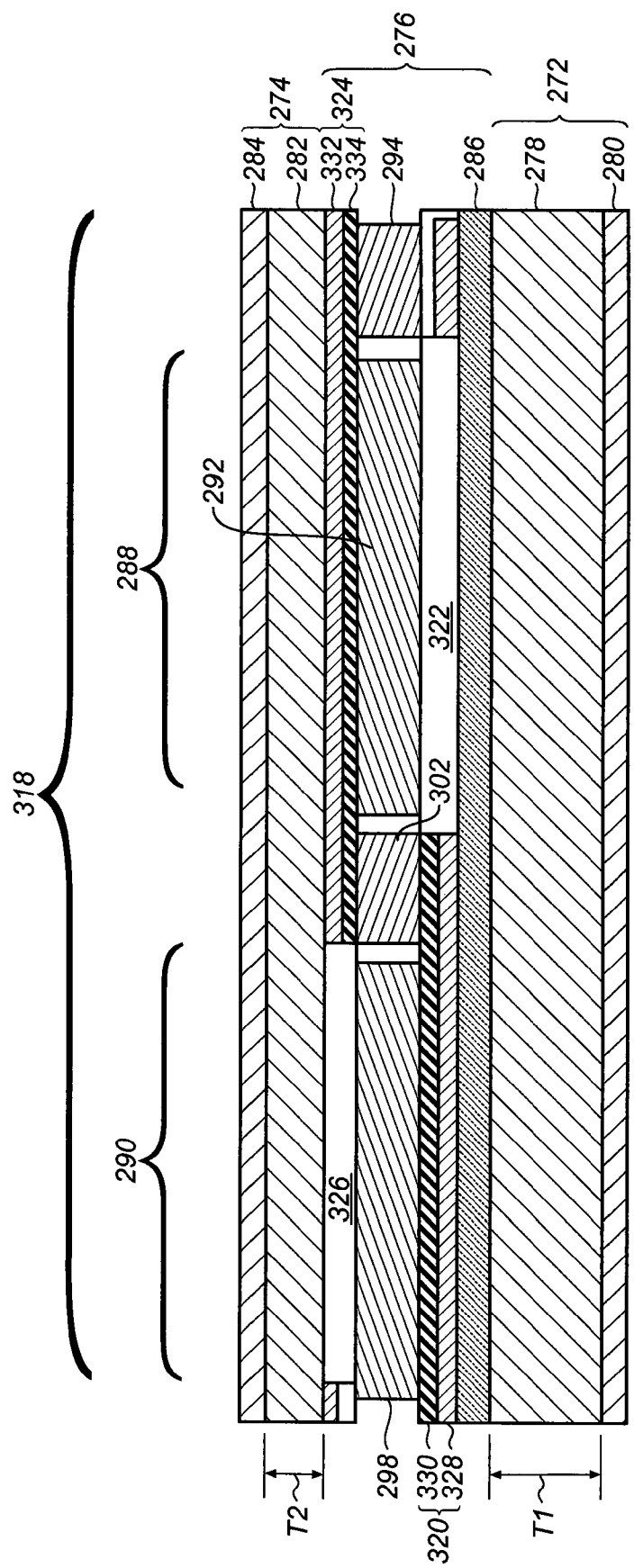
FIG. 8 is a schematic cross-sectional of yet another embodiment of the invention similar to that of FIG. 7, but in which light masking assemblies are provided to direct light to the photosensors.

An alternate construction of the embodiment of FIG. 7 is shown in FIG. 8. In this embodiment, an imaging device 318 further includes a first light masking assembly 320 having first clear apertures 322 that allow light from the first phosphor screen assembly 272 to be transmitted to the first light-sensitive element 292; and a second light masking assembly 324 having second clear apertures 326 that allow light from second phosphor screen assembly 274 to be transmitted to second light sensitive element 298. The light masking layers may be absorptive or reflective outside of apertures 322, 326 and may be formed of inorganic materials, such as metals, of organic materials, such as absorptive dyes in an organic binder, or of combinations such as pigments or carbon contained in an organic binder.

First masking assembly 320 includes a first light blocking layer 328 with the first clear apertures 322 and an insulator layer 330. Similarly, second masking assembly 324 includes a light blocking layer 332 with second clear apertures 326 and an insulator layer 334. It will be recognized by those skilled in the art that insulating layers 330, 334 may not be required in some implementations of imaging device 318, such as those in which the masking layers 328, 332 are themselves insulating, while in others a second insulating layer may be required to prevent electrical shorting or to block diffusion of impurities, such as sodium, from the thin transparent substrate into the imaging array. Masking assemblies 320, 324 may be either absorptive or reflective. An absorptive masking assembly reduces scattering of light from the scintillating phosphor screens, thereby reducing optical crosstalk between nearby photosensitive elements at the expense of reduced overall light collection efficiency. Absorptive masking assemblies thereby optimize overall performance for high spatial frequency response at the expense of signal-to-noise. For first masking assembly 320, a reflective masking assembly causes light incident on the assembly to be reflected back into the thin transparent substrate. A portion of the light reflected into the substrate may undergo repeated internal reflections before being transmitted through one of first apertures 322 in the masking assembly. Another portion may be transmitted from the transparent substrate into first phosphor screen assembly 272, where it may be absorbed or scattered into one of apertures 322 in the masking assembly. A reflective masking assembly thereby optimizes for signal-to-noise at the expense of spatial frequency response.

Figure 9:
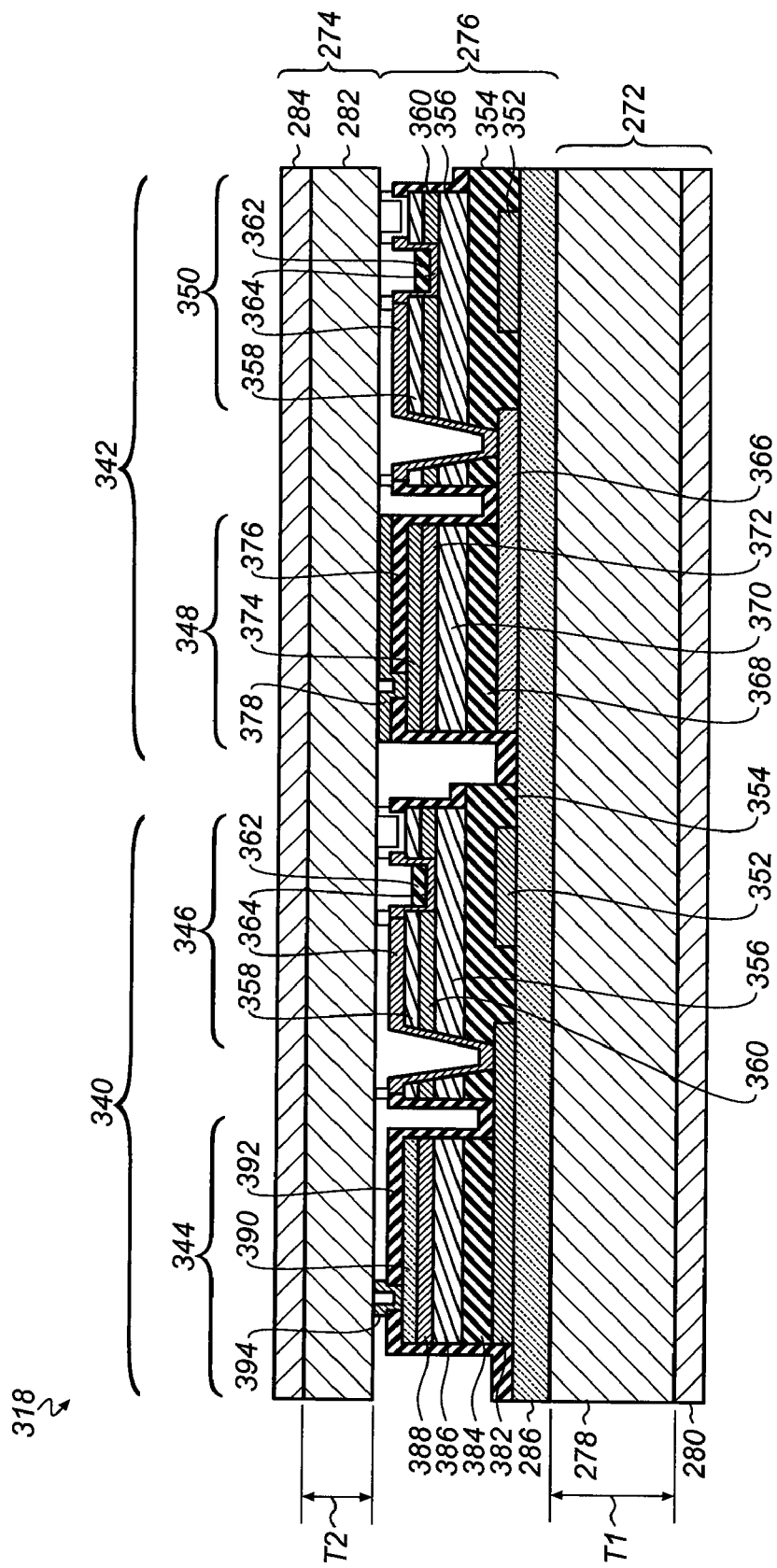
FIG. 9 shows a detailed cross-sectional view of the inventive imaging pixel of FIG. 8.

FIG. 9 shows a particular implementation of imaging device 318 shown in FIG. 8, using MIS photosensors for light sensitive elements. As discussed above, imaging device 318 includes first phosphor screen assembly 272, second phosphor screen assembly 274 and imaging array 276. Imaging array 276 includes thin, transparent substrate 286, first photosensitive elements 342 primarily sensitive to light emitted from first phosphor screen 278 and second photosensitive elements 340 primarily sensitive to light emitted from second phosphor screen 282. Second photosensitive element 340 includes a second MIS photosensor 344 and a second TFT readout element 346 in which the MIS photosensor is primarily sensitive to light from second phosphor screen 282. First photosensitive element 342 includes a first MIS photosensor 348 and a first TFT readout element 350. First MIS 348 photosensor is primarily sensitive to light from first phosphor screen 278.

Continuing with regard to FIG. 9, each of TFT readout element 346, 350 includes a first layer of metal 352 forming a TFT gate electrode and gate line, an insulator layer 354 forming the gate dielectric, an intrinsic amorphous silicon film 356 forming the TFT channel, an amorphous silicon film 358 containing n-type dopant forming source and drain regions of the TFT, a third layer of metal 360 forming source and drain contacts, an insulator layer 362 and a fourth layer of metal 364 forming data lines and interconnections between TFTs 346, 350 and photosensitive elements 344, 348.

First MIS photosensor 348 comprises a second layer of metal 366 forming a transparent gate electrode, an insulator layer 368 forming a gate dielectric, an intrinsic amorphous silicon film 370, an n-doped amorphous silicon film 372, a third layer of metal 374 forming contact to the n-doped amorphous silicon film, an insulator layer 376 and a fourth layer of metal 378 forming the bias line. Second layer of metal 366 may be formed with transparent conductors such as ITO or IZO. Fourth layer of metal 378 in first MIS photosensor 348 is patterned so as to leave metal over the photosensitive area of the MIS photosensor, thereby blocking light from second phosphor screen 282 from being transmitted into the photosensor. Thereby first MIS photosensor 348 is primarily responsive to light from first phosphor screen 278, which can be transmitted through the thin transparent substrate 286 and transparent gate electrode 366.

Second MIS photosensor 344 is similar in construction to first MIS photosensor 348 and includes a second layer of metal 382 forming the gate electrode, an insulator layer 384 forming a gate dielectric, an intrinsic amorphous silicon film 386, an n-doped amorphous silicon film 388, a third layer of metal 390 forming contact to n-doped amorphous silicon film 388, an insulator layer 392 and a fourth layer of metal 394 forming the bias line. Third layer of metal 390 is transparent, allowing light from second phosphor screen 282 to be transmitted into second MIS photosensor 344, while second layer of metal 382 is opaque, thereby preventing light from first phosphor screen 278 to be transmitted to second MIS photosensor 344. Thereby second MIS photosensor 344 is primarily sensitive to second phosphor screen 282.

Figure 10:
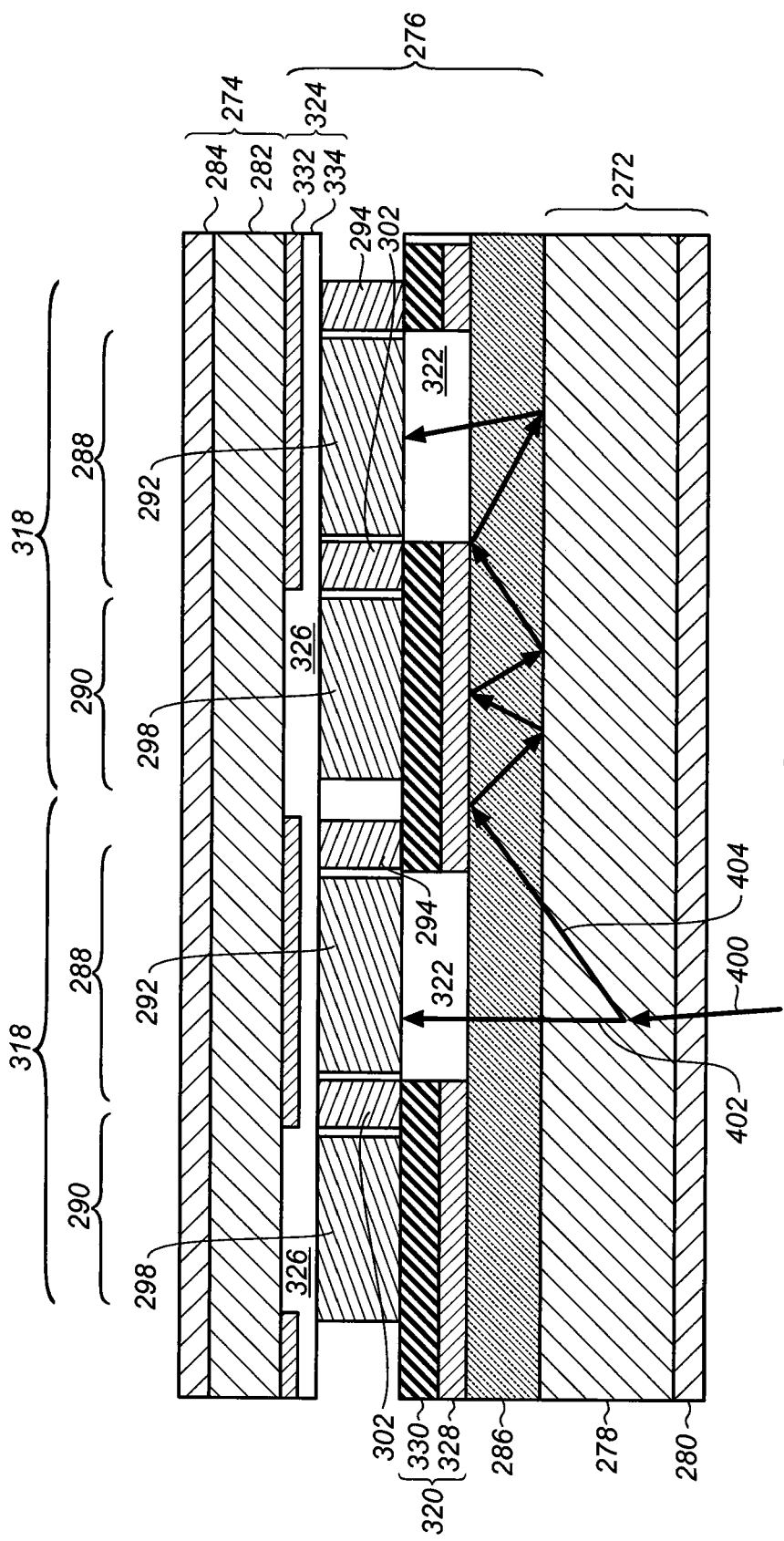
FIG. 10 shows a schematic cross-section of two side-by-side pixels in accordance with FIG. 8 and illustrates how light scattering can occur in the transparent substrate.
Figure 11:
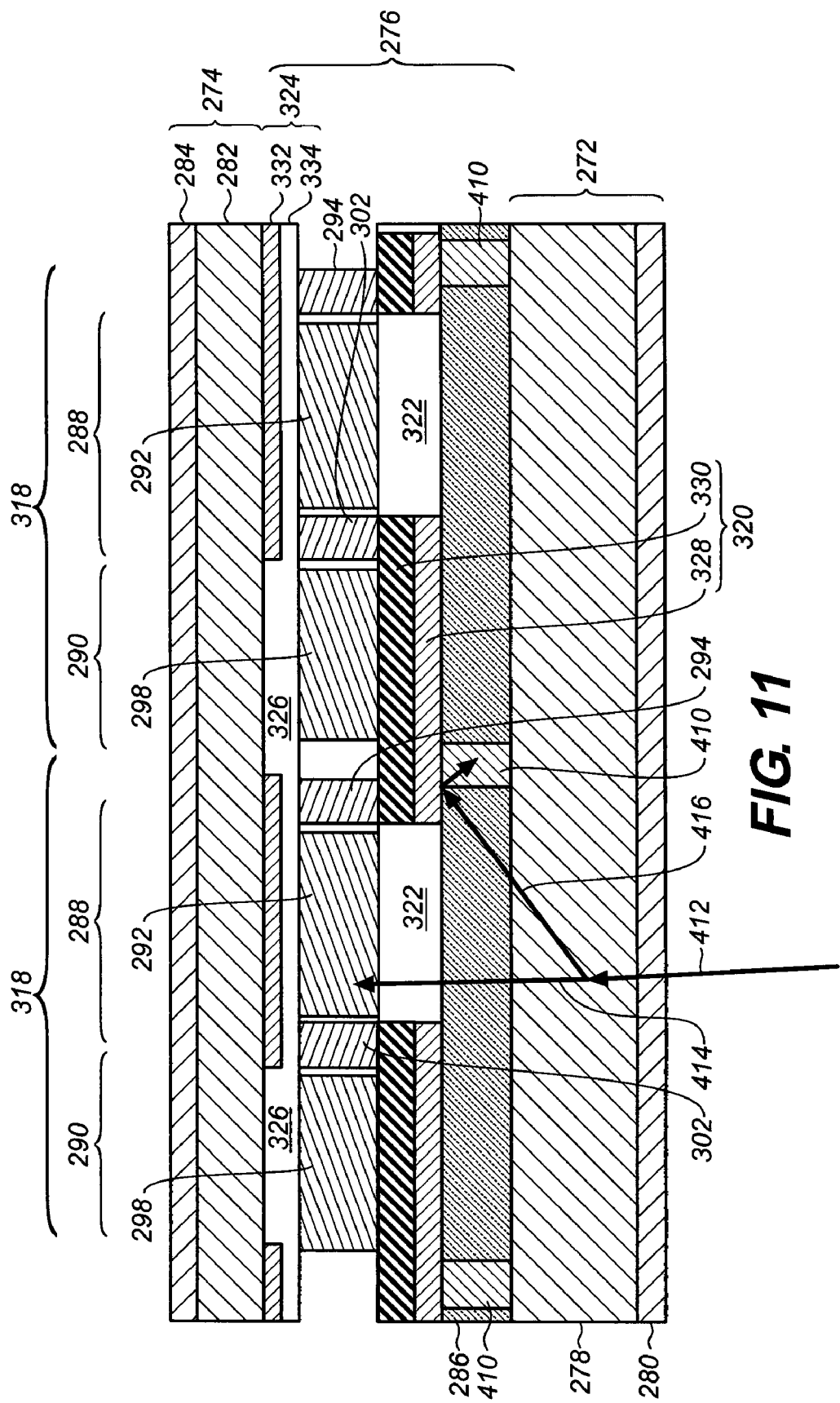
FIG. 11 shows a schematic cross-section as in FIG. 10, but including features for reducing light scattering in the transparent substrate.

FIG. 10 shows an expanded embodiment of the imaging device shown in FIG. 8 and illustrates how emitted light can be scattered along substrate 286. An x-ray 400 is absorbed in first phosphor screen 278 and light 402 is emitted therefrom that passes through first apertures 322 to reach first light sensitive element 292 corresponding to the location at which x-ray 400 was absorbed. However, some emitted light 404 undergoes multiple internal reflections and scatters along substrate 286 before eventually passing through an adjacent one of the first apertures 322. Such light scattering may lead to erroneous signals at the adjacent light sensitive element 292 since the absorbed light corresponds to x-rays absorbed at a non-corresponding location. FIG. 11 shows one technique for reducing such light scattering. A pattern of light blocking regions 410 is provided in substrate 286. The light blocking regions 410 may be formed by thermal diffusion of a light-absorbing colorant into the thin, transparent substrate from either or both surfaces of the substrate surface. One method for patterned thermal transfer of a colorant into a substrate from a colorant-containing donor sheet is described in U.S. Pat. No. 4,621,271. A method for patterned laser transfer of colorant from a donor sheet to a receiver sheet by means of heat created by pattern-wise exposure to a laser is described in U.S. Pat. Nos. 4,772,582; 4,973,572 and 5,578,416. Alternatively, the light absorbing substrate may contain photo-active components which, when pattern-wise exposed to heat or light, release colorant or bleach pre-existing colorants, as described in U.S. Pat. Nos. 4,399,209; 4,416,966 and 4,440,846. Alternatively, the substrate may be formed of a photo-patternable polymer, such as photo-patternable polyimide, which is then chemically developed to form trenches that may be subsequently filled with light-absorbing or light reflecting material (such as polymers containing colorants), or with reflective or scattering particles, or with deposited or plated metals. Alternatively, a metal grid defining the light-blocking regions may be formed by electroplating a metal from a patterned metallic seed layer. The patterned grid layer may then coated with a substantially transparent material, such as polyimide.

As in the case of FIG. 10, an x-ray 412 is absorbed in first phosphor screen 278 and light 414 is emitted therefrom that passes through one of first apertures 322 to reach first light sensitive element 292 corresponding to the location at which x-ray 400 was absorbed. However, if any emitted light 416 undergoes multiple internal reflections and scatters along substrate 286, such scattered light encounters light blocking regions 410 which prevent the scattered light from reaching an adjacent one of first apertures 322. Improved accuracy results due to the reduction in light scattering.

Figure 12:
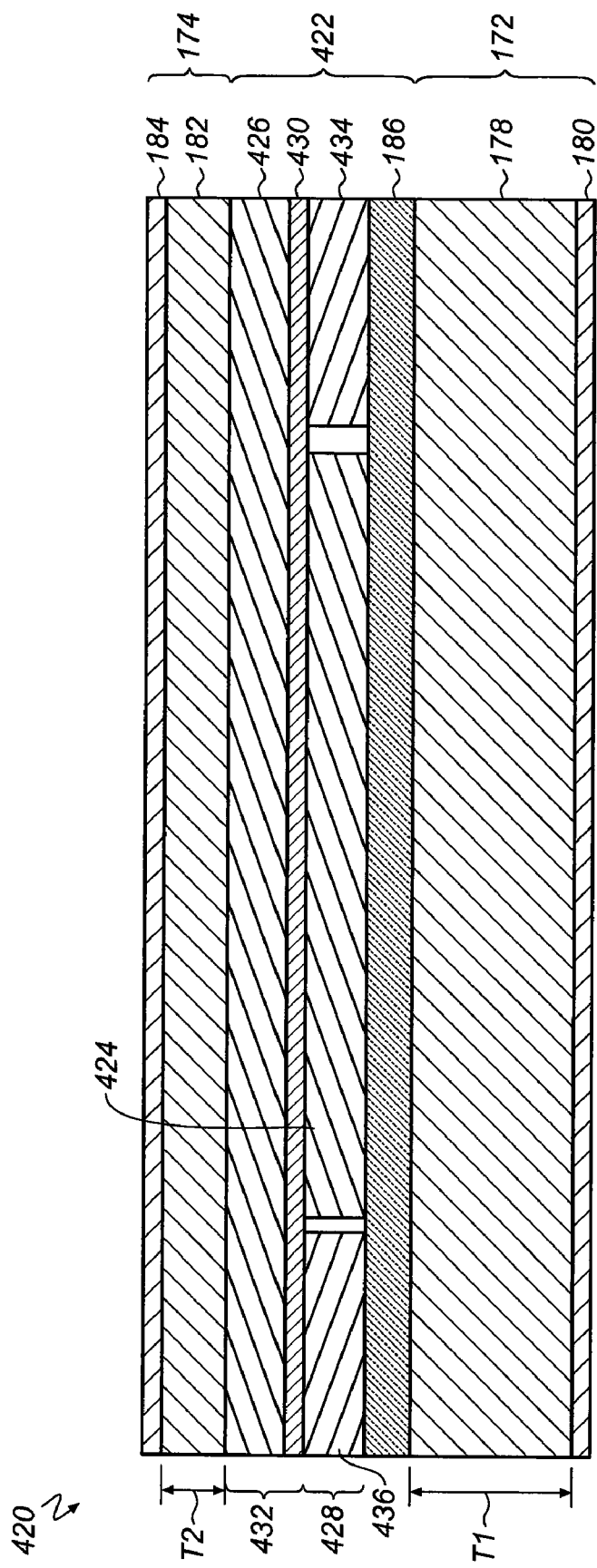
FIG. 12 shows a schematic cross-section of still another embodiment of the invention, in which the photosensors of the imaging device are arranged in two separate planes or layers with a light blocking layer between the planes.

An alternate imaging device 420 is shown in FIG. 12. Features common to the embodiment of FIG. 5 are identified by the same reference numerals. In this embodiment an imaging array 422 has photosensors arranged in separate, essentially parallel planes. More specifically, a first plane 428 has first light-sensitive elements (photosensors) 424 primarily sensitive to light emitted from first phosphor screen 178 and a second plane 432 has second light-sensitive elements (photosensors) 426, arranged above the first plane 428, primarily sensitive to light emitted from second phosphor screen 182. Imaging array 422 comprises thin, transparent substrate 186, first plane 428 having first light-sensitive elements 424 disposed on the side of substrate 186 opposite first phosphor screen 178, a light blocking layer 430 disposed on the first plane 428, second plane 432 of having second sensing elements 426 disposed on the opposite side of layer 430 from light sensing element 424, and first and second readout elements 434, 436 for first and second light sensing elements 424, 426, respectively. In imaging device 420, readout elements 434, 436 are disposed in first plane 428 with first light sensing elements 424. The readout elements could alternatively be located in second plane 432 or in a third plane, not illustrated. First light sensing elements 424 are primarily sensitive to light from first phosphor screen 178 and second light sensing elements 426 are primarily sensitive to light from second phosphor screen 182. Light blocking layer 430 may not be required if light sensing elements 424, 426 are sufficiently optically absorptive of light from their respective phosphor screens; so that, only a small fraction of light from first phosphor screen 178 is transmitted through first light sensing element 424 to second light sensing element 426; and only a small fraction of light from second phosphor screen 182 is transmitted through second light sensing element 426 to first light sensing element 424.

Figure 13:
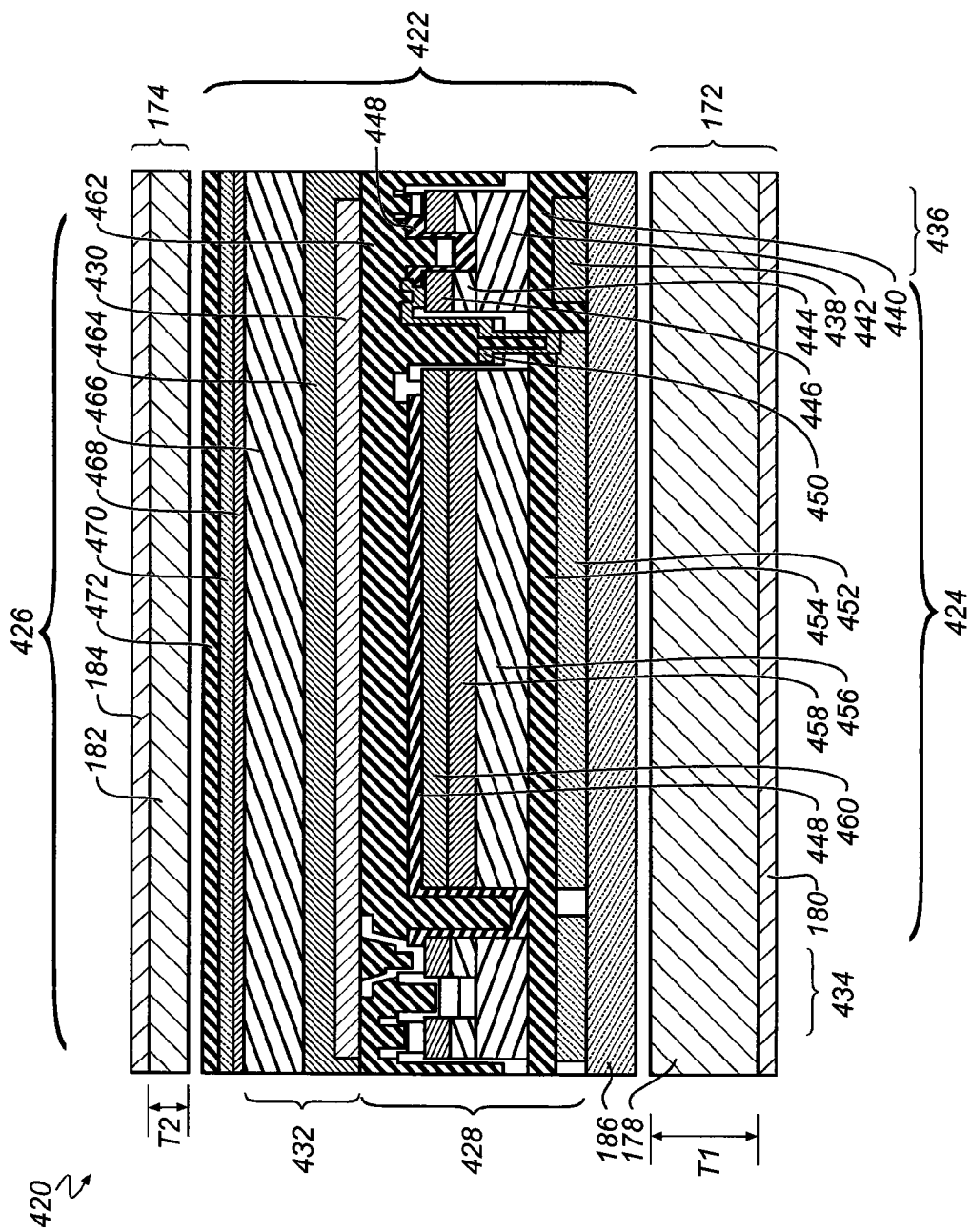
FIG. 13 shows a detailed cross-sectional view of the inventive imaging pixel of FIG. 12.

FIG. 13 shows a partially exploded, sectioned view of a particular implementation of the embodiment shown in FIG. 12. Imaging array 422 includes transparent substrate 186, first plane 428 including first light-sensitive elements 424 (denoted by a bracket below the figure) disposed on the side of substrate 186 opposite first phosphor screen 178, light blocking layer 430, second plane 432 including second light sensitive element 426 (denoted by a bracket above the figure) disposed on the opposite side of light blocking layer 430 from first light sensitive element 424, and readout elements 434, 436 (denoted by brackets below the figure) for light sensitive elements 424, 426, respectively.

Continuing with regard to FIG. 13, readout elements 434, 436 preferably are TFTs and light sensitive elements 424, 426 are MIS photosensors. Each TFT includes a first layer of metal 438 forming the gate electrode and gate lines, an insulator layer 440 forming a gate dielectric, an intrinsic amorphous silicon film 442 forming the channel, an amorphous silicon layer 444 containing an n-type dopant forming the source and drain regions, a third layer of metal 446 forming source and drain contacts, an insulator layer 448, and a fourth layer of metal 450 forming interconnections from the TFTs to their respective MIS photosensors 424, 426 and forming data lines. First MIS photosensor 424, which is primarily sensitive to light from first phosphor screen 178, comprises a second layer of metal 452 that is transparent to light emitted by first screen 178, an insulator layer 454 forming a gate dielectric, an intrinsic amorphous silicon layer 456 forming the channel region, an amorphous silicon layer 458 containing n-type dopant forming the drain region, a third layer of metal 460 forming the drain contact, a portion of insulator layer 448, and fourth layer of metal 450 forming interconnections from TFT 436 to MIS photosensor 424 and forming data lines. An insulator layer 462 is formed over the readout elements and the MIS photosensors. Second MIS photosensor 426 includes a fifth layer of metal 464 forming a gate electrode, an intrinsic amorphous silicon film 466 forming the channel region, an amorphous silicon film 468 containing n-type dopant, a sixth layer of metal 470 forming a transparent contact to second MIS photosensor 426, and an insulator layer 472. In the embodiment shown in FIG. 13, the layers 464 to 472 extend across the entire imaging surface of the imaging array, thereby allowing nearly the entire surface to be photosensitive.

Figure 14:
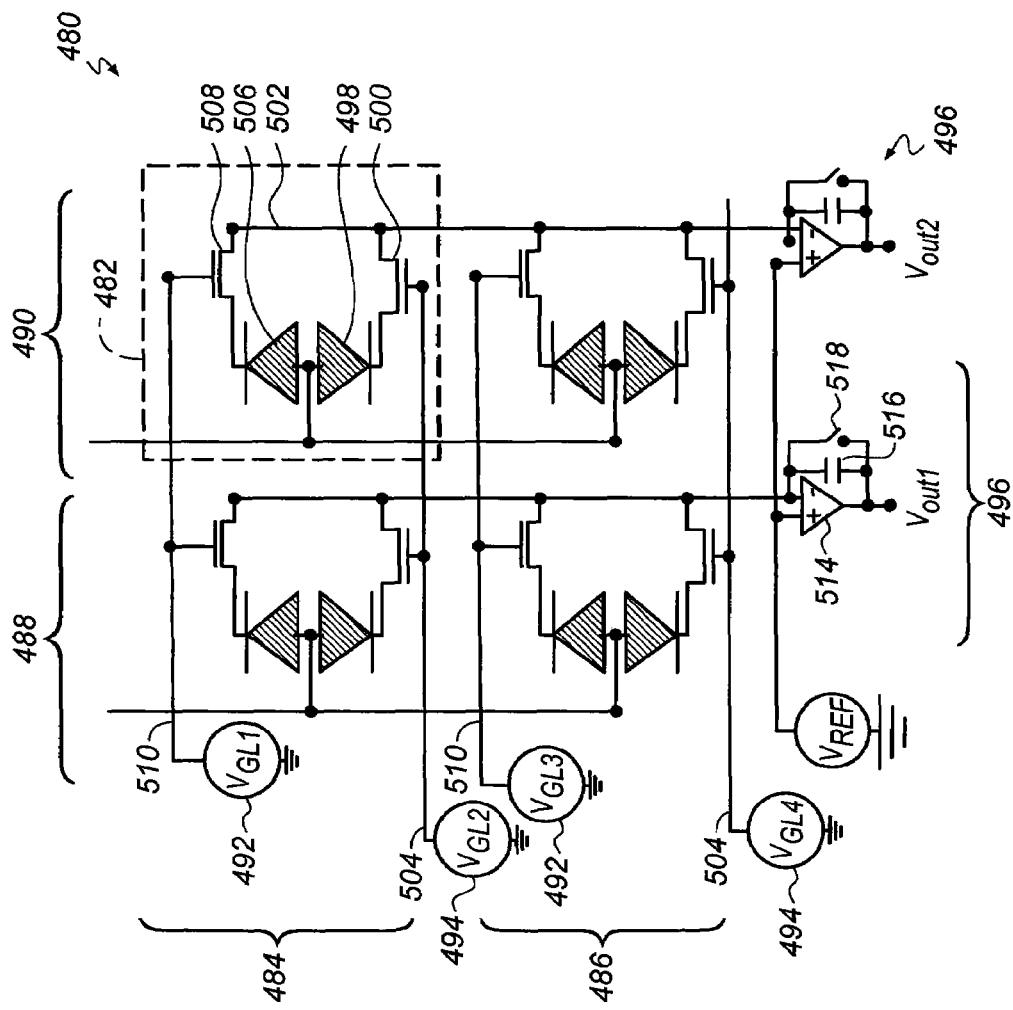
FIG. 14 shows a schematic diagram of a circuit for use with imaging devices in accordance with the invention.

FIG. 14 shows an example of an imaging array circuit 480 suitable for reading out the imaging arrays illustrated in FIGS. 7 to 13. Each imaging array comprises pixels 482 (denoted by a dashed line box) arranged in rows 484, 486 and columns 488, 490, voltage sources 492, 494 for scanning the rows sequentially, and read-out circuitry 496 for sensing charge. Each pixel 482 includes a first light sensitive element 498 and a corresponding TFT switch 500 to connect the light sensing element to a data line 502 under the control of a first gate line 504, and a second light sensitive element 506 with a corresponding TFT switch 508 to connect the light sensing element to data line 502 under the control of a second gate line 510. The first and second gate lines in each row are biased using the voltage sources 492, 494, respectively. The charge created by light exposure in the light sensitive elements is sensed by read out circuitry 496 on each of the data lines. Read out circuitry 496 preferably includes an operational amplifier 514, a feedback capacitor 516, and a switch 518. During X-ray exposure, the bias supplies for the gate lines are held at negative voltage to turn off all of the TFT switches. Following exposure, the gate lines are sequentially addressed by switching the bias voltage to a positive value, creating a conductive path between the source and drain of the TFT and thereby connecting the charge amplifier at the end of each column to the selected image sensing element. The charge amplifier senses the charge on the light sensitive element, following which the gate line is returned to a negative value, thereby switching it off. The output of the charge amplifier may be digitized and stored. Following scanning of all of the gate lines, image planes representing the first and second light sensitive elements can be combined to produce an image.

The scintillating phosphor screens in the embodiments of FIGS. 7 to 13 can be conventional radiographic intensifying screens. Intensifying screens have a luminescent layer in which prompt emitting phosphor is dispersed as a particulate in a polymeric matrix and have additional layers such as support layers, protective overcoats, and retainers. Suitable prompt emitting phosphors are well known, for example, rare-earth oxysulfides doped with a rare-earth activator, e.g., $Gd_2O_2S:Tb$, calcium tungstate, yttrium oxide, barium fluorohalide, $HfO_2:Ti$, $HfGeO_4:Ti$, $LuTaO_4$, $Gd_2O_3:Eu$, $La_2O_2S$, $LaOBr$, $CsI:Tl$, $YTaO_4$, $Y_2O_2S:Tb$, $CaWO_4$, $BaFBr:Eu$, or $LaOBr:Tm$, or combinations thereof. A blend of different phosphors can also be used. The median particle size utilized is generally between about 0.5 μm and about 40 μm. A median particle size of between 1 μm and about 20 μm is preferred for ease of formulation, as well as optimizing properties, such as speed, sharpness and noise. The scintillating phosphor screens for the embodiments of the present invention can be prepared using conventional coating techniques where the phosphor powder is mixed with a solution of a resin binder material and coated by means such as blade coating onto a substrate. The binder can be chosen from a variety of known organic polymers that are transparent to X-rays, stimulating, and emitting light. Binders commonly employed in the art include sodium o-sulfobenzaldehyde acetal of poly(vinyl alcohol); chloro-sulfonated poly(ethylene); a mixture of macromolecular bisphenol poly(carbonates) and copolymers comprising bisphenol carbonates and poly(alkylene oxides); aqueous ethanol soluble nylons; poly(alkyl acrylates and methacrylates) and copolymers of poly(alkyl acrylates and methacrylates with acrylic and methacrylic acid); poly(vinyl butyral); and poly(urethane) elastomers. However, any conventional ratio phosphor to binder can be employed. Generally, thinner phosphor layers and sharper images are realized when a high weight ratio of phosphor to binder is employed. Phosphor-to-binder ratios in the range of about 7:1 to 25:1 are preferable. The intensifying screen is not limited to the use of crystalline phosphors for the X-ray-to-light conversion. For example, a scintillating glass or organic scintillator can be used.

The several embodiments of the present invention utilize multiple scintillator layers in a DR imaging device in order to maximize the somewhat conflicting requirements for improved signal-to-noise ratio (SNR) and improved modulation transfer function (MTF). For example, in the embodiment of FIG. 12, phosphor screen 182 has thickness t2 that is relatively thinner than thickness t1 of phosphor screen 178. With inherently less scattering, phosphor screen 182 is optimized for resolution and MTF, while thicker phosphor screen 178 is optimized for SNR. For example, the thickness of phosphor screen 182 may be 97 μm (having a coating weight of 45.3 mg/cm$^2$ of $Gd_2O_2S:Tb$), while the thickness of phosphor screen 178 may be 186 μm (having a coating weight of 82.7 mg/cm$^2$ of $Gd_2O_2S:Tb$). Phosphor screen 182 may have a light control layer 184 of black, absorptive material and phosphor screen 178 may have a light control coating 180 of black absorptive material. Using the typical X-ray beam for general radiography (the DN5 beam), the spatial frequency at which the MTF would equal 50% ($f_{1/2}$) is 3.8 c/mm and 2.4 c/mm for phosphor screen 182 and phosphor screen 178, respectively. At the same time, the X-ray absorption efficiency of phosphor screen 178 is 47% as compared to 29% for phosphor screen 182. In practical designs, the MTF of phosphor screen 178 would exceed the MTF of phosphor screen 182 such that the spatial frequency at which the MTF is 50% ($f_{1/2}$) for phosphor screen 178 is higher than that for phosphor screen 182 by at least 0.5 c/mm. In addition, the X-ray absorption efficiency of phosphor screen 182 would exceed that of phosphor screen 178 by at least 10%. Imaging array 422 is capable of reading the resulting image from each of phosphor screens 178, 182, so that the combined image can provide higher quality than is available with conventional DR systems with a single phosphor screen.

The material composition of the phosphor screens useful in the embodiments of the invention can include one or more of $Gd_2O_2S:Tb$, $Gd_2O_2S:Eu$, $Gd_2O_3:Eu$, $La_2O_2S:Tb$, $La_2O_2S$, $Y_2O_2S:Tb$, $CsI:Tl$, $CsI:Na$, $CsBr:Tl$, $NaI:Tl$, $CaWO_4$, $CaWO_4:Tb$, $BaFBr:Eu$, $BaFCl:Eu$, $BaSO_4:Eu$, $BaSrSO_4$, $BaPbSO_4$, $BaAl_{12}O_{19}:Mn$, $BaMgAl_{10}O_{17}:Eu$, $Zn_2SiO_4:Mn$, $(Zn, Cd)S:Ag$, $LaOBr$, $LaOBr:Tm$, $Lu_2O_2S:Eu$, $Lu_2O_2S:Tb$, $LuTaO_4$, $HfO_2:Ti$, $HfGeO_4:Ti$, $YTaO_4$, $YTaO_4:Gd$, $YTaO_4:Nb$, $Y_2O_3:Eu$, $YBO_3:Eu$, $YBO_3:Tb$, or $(Y,Gd)BO_3:Eu$, or combinations thereof. Phosphor screens 178 and 182, for instance, can be of the same or of different material composition. For example, phosphor screens 178 and 182 may have the same phosphor material but with different particle size distributions. The median particle size of phosphor material on phosphor screen 182 may be in the range from about 1 to about 5 microns, whereas the median particle size of phosphor material on phosphor screen 178 may be in the range from about 6 to about 15 microns. For example, the atomic number of heavy elements may differ in phosphor screens useful in the embodiments of the invention. For example, for higher X-ray energy absorption, phosphor screen 182 may have a composition having an element of higher atomic number than that of phosphor screen 178. For example, phosphor screen 182 may contain $Gd_2O_2S$:Tb while phosphor screen 178 may contain $Y_2O_2S$:Tb. Gadolinium (Gd) has an atomic number of 64, whereas yttrium (Y) has an atomic number of 39.

Moreover, the spatial frequency response of phosphor screens useful in the embodiments of the invention may be different with the use of different phosphor materials with different structures. For example, phosphor screen 182 may comprise a columnar structured phosphor such as CsI:Tl, while phosphor screen 178 may comprise a powder phosphor such as $Gd_2O_2S$:Tb. When evaporated under appropriate conditions, a layer of CsI will condense in the form of needle-like, closely packed crystallites with high packing density. Such a columnar or needle-like phosphor is well known in the art. See, for example, ALN Stevels et al., "Vapor Deposited CsI:Na Layers: Screens for Application in X-Ray Imaging Devices," Philips Research Reports 29:353-362 (1974); and T. Jing et al, "Enhanced Columnar Structure in CsI Layer by Substrate Patterning", IEEE Trans. Nucl. Sci. 39: 1195-1198 (1992). In this form, the spatial frequency response (or resolution) is improved over that for a powder phosphor screen of the same thickness, presumably because the columnar crystallites enhance the forward scattering of the light compared to a powder phosphor screen. These columns can be thought to act like fiber optic light guides such that light photons produced by the absorption of an incident X ray will be guided towards either end of the pillars. Similar to powder screens, a reflective backing is used to maximize the light collection capabilities of the layer by redirecting light photons towards the exit surface. For example, phosphor screen 182 may have a CsI:Tl layer with a thickness of 89 microns, while phosphor screen 178 may have a $Gd_2O_2S$:Tb layer with a thickness of 93 microns. The spatial frequency response of phosphor screen 182 may be higher than that of phosphor screen 178. The values of the spatial frequency at which the MTF equals 50% ($f_{1/2}$) are 4.7 c/mm and 3.3 c/mm for phosphor screens 182 and 178, respectively. In general, x-ray radiation is incident on the side of an imaging device 170, 210, 270, 318, 420 or others in accordance with the invention, that side having the thinner phosphor screen, closer to the x-ray source such that MTF of the thinner screen is optimized. Alternatively, x-ray radiation may be incident on the thicker of phosphor screens, such that the SNR of the thicker screen is optimized.

A potential problem with the embodiments of FIGS. 5 to 10, 12 and 13 concerns light scattering within the thin, transparent substrate 186, 230, 286. Phosphor screens often have an optical index of refraction of 1.6 or higher, while transparent substrates such as plastic have a lower index of refraction typically in the range of 1.46 to 1.59 and the amorphous silicon has a typical index of refraction in the range of 2.9 to 3.7. As a result, as discussed briefly regarding FIGS. 10 and 11, light entering the thin, transparent substrate from the phosphor screen can undergo multiple internal reflections within the substrate, resulting in optical crosstalk between neighboring pixels. Since the phosphor screen typically is a diffuse reflector, the angle of reflection may not equal the angle of incidence at the screen-substrate boundary.

Figure 15:
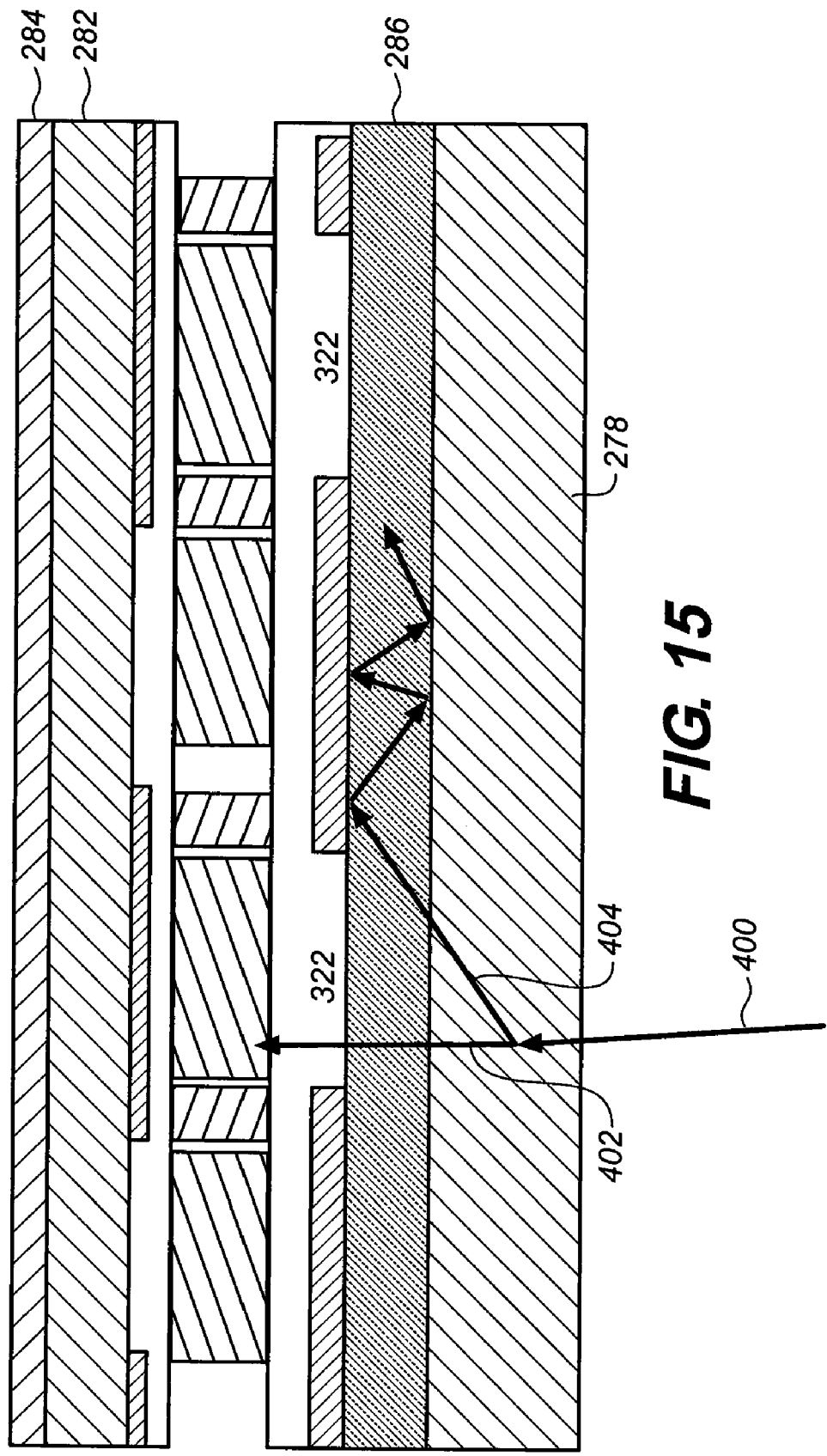
FIG. 15 shows a schematic cross-section of the embodiment of FIG. 8 in which a light-absorbing colorant has been diffused through the transparent substrate to reduce light scatter.

One solution for this problem is disclosed in the embodiment of FIG. 11. Another solution is shown in the embodiment of FIG. 15 wherein the thin, transparent substrate 286 is made from a material that contains a fairly uniform density of colorant or light-scattering particles. For example, the substrate material could be a polyimide, a colorant material could be carbon particles or a light-scattering particle could be titanium dioxide. The colorant could, for example, be added during the manufacture of the substrate. The dye density preferably is chosen to achieve low absorption for light traveling directly across the substrate between the scintillator and the photosensor, while achieving a desired degree of crosstalk suppression for light undergoing total internal reflection and thereby traveling from one pixel to a neighboring pixel. This is possible at least in part because the substrate is typically thinner than the pixel pitch. Alternatively, a light-scattering material (such as glass or polymer beads of index different than the transparent substrate) may be used in place of a colorant to reduce lateral light-piping in the substrate. Alternatively, instead of a uniform colorant concentration, microbeads containing colorant may be dispersed in or on the substrate. As illustrated in FIG. 15, scatter of light 404 would be reduced, compared to the scatter shown and described with regard to FIG. 10.

Figure 16:
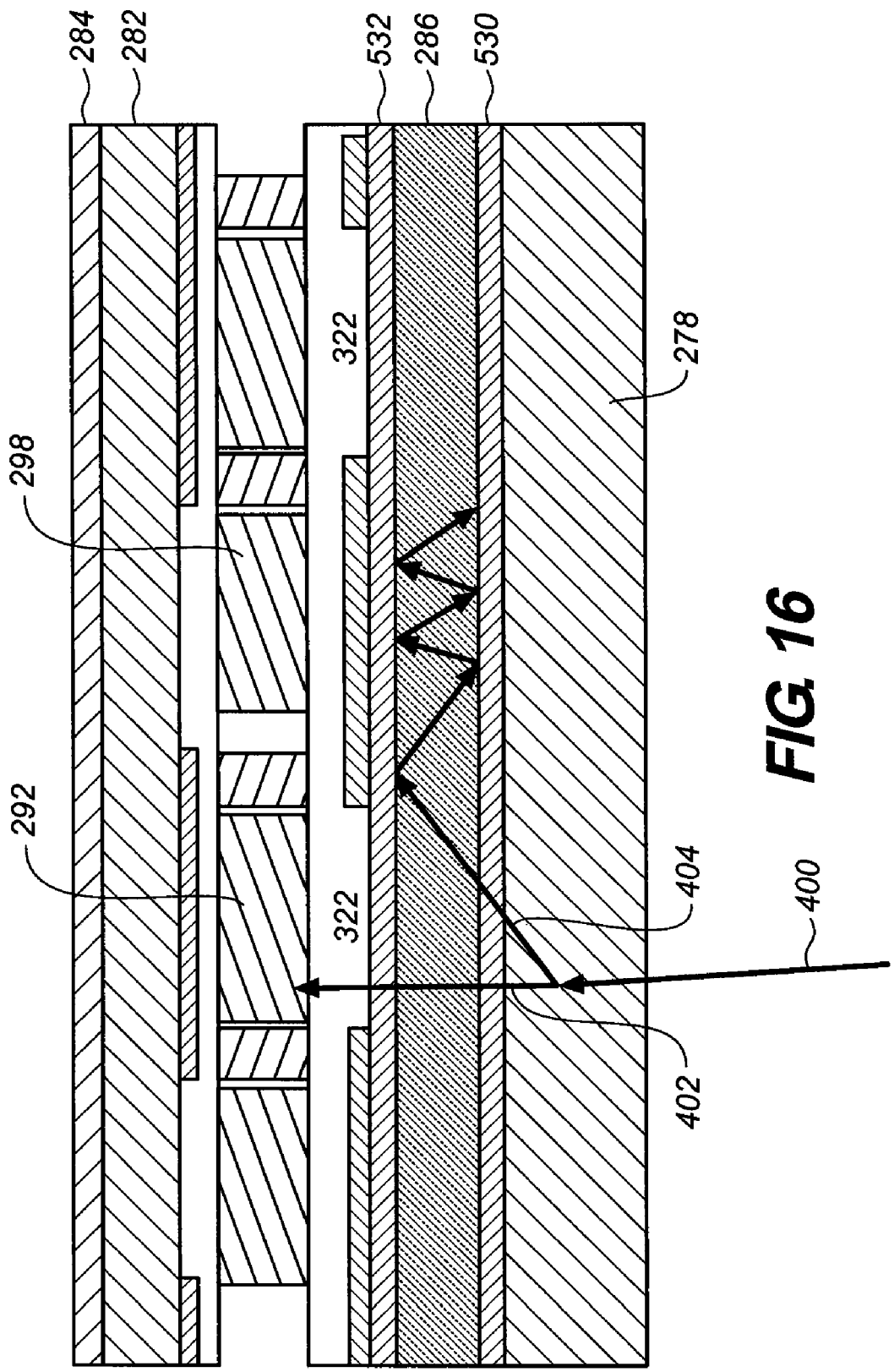
FIG. 16 shows a schematic cross-section of the embodiment of FIG. 8 in which a light-absorbing colorant has been applied to the surfaces of the transparent substrate to reduce light scatter.

In another solution, shown in FIG. 16, light-absorbing surface borders 530, 532 are formed on substrate 286 using, for example, a patterned application of dye onto one or both sides of the substrate. The dye concentration preferably is adjusted to suppress light transmission laterally through the border regions, and thus scatter of light 404 is reduced. Thermal dye transfer from a donor sheet to a receiver sheet is an example of a process that could be used to achieve patterned absorbing regions. For example, laser thermal dye transfer, widely used in applications for digital printing proofs and digital printing plates, can achieve a line width of 10 microns or less. Examples of receiving layers for colorants include polycarbonate, polyurethane, polyester, polyvinyl chloride or mixtures thereof. Alternatively, layers of the above colorant-receiving materials could be coated on one or both sides of a support such as poly(ether sulfone) or a polyimide. The colorant, which is pattern-wise transferred from a donor sheet by thermal energy, could be a sublimable dye or an inorganic colorant. Examples of sublimable dyes include anthraquinone dyes, such as KTS Black 146 (product of Nippon Kayaku Co., Ltd), azo dyes such as Sumickaron Diazo Black 5G (product of Sumitomo Chemical Co., Ltd). An example of an inorganic colorant would be carbon particles.

Figure 17:
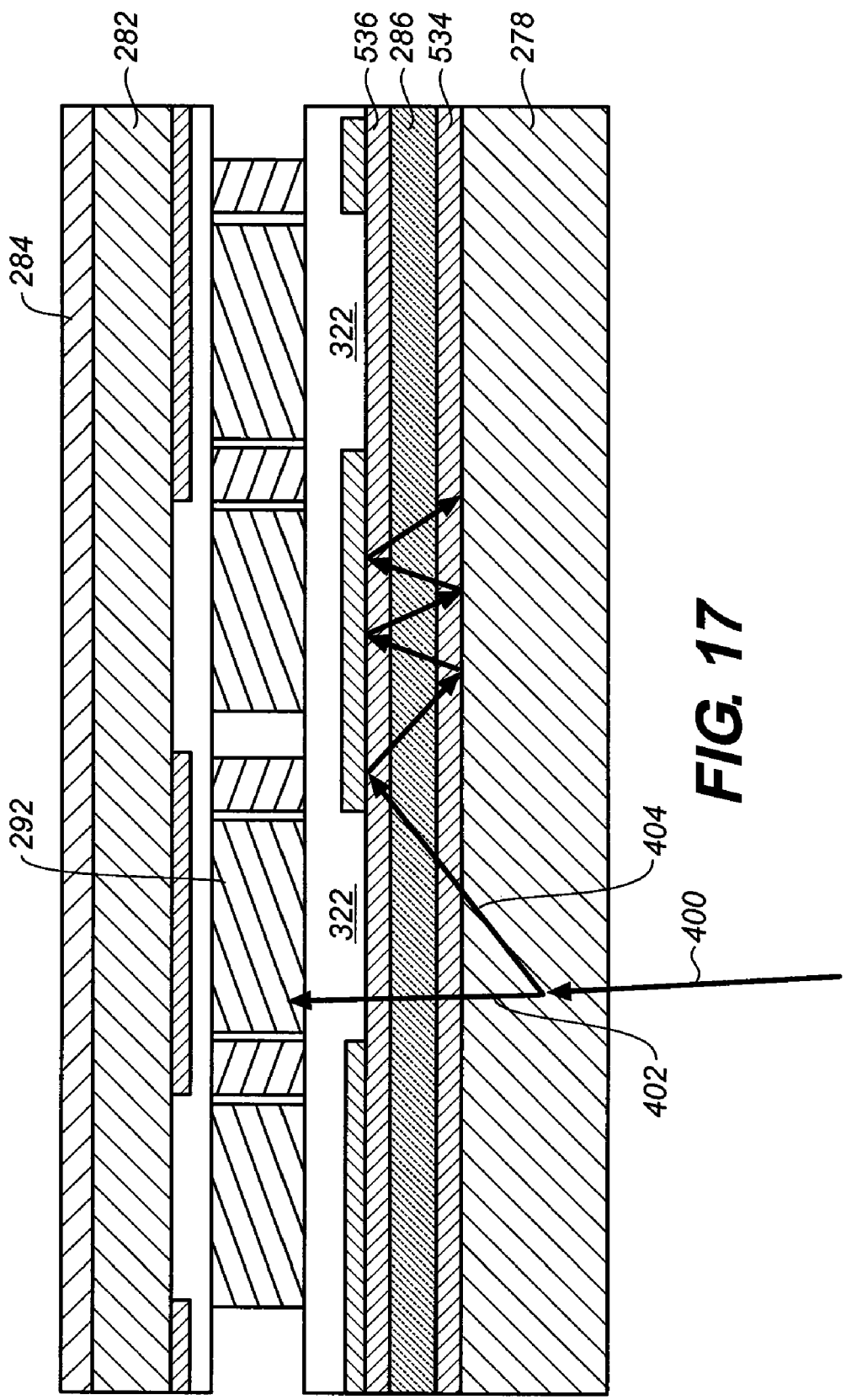
FIG. 17 shows a schematic cross-section of the embodiment of FIG. 8 in which a light-absorbing colorant has been diffused into layers at the surfaces of the transparent substrate to reduce light scatter.

In still another solution, shown in FIG. 17, a colorant is diffused into one or both surfaces of substrate 286 forming diffused layers 534, 536. In this embodiment, light undergoing multiple internal reflections makes multiple passes through diffused layers 534, 536, whereas light transmitted directly through substrate 286 from phosphor screen 278 to photosensor 292 would make only one pass. In this manner, it is possible to reduce light scatter among pixels without unduly impacting sensitivity. For example, the colorant pattern in the substrate may be formed by the spatially-uniform transfer of colorant from a colorant-containing liquid brought in contact with the colorant-receiving layer or by thermal transfer from a donor sheet to a receiving layer. Examples of receiving layers, colorants and dyes are as stated in the preceding paragraph. Alternatively, a substantially light-transparent substrate material such as polyimide could be coated on one or both surfaces with a binder, such as polyimide, containing a colorant, such as carbon particles or dyes such as those listed above.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. Thus, what is provided is an apparatus and method for flat panel digital imaging using dual scintillating phosphor screens.

The invention claimed is:

1. A radiographic imaging device comprising:
a first scintillating phosphor screen having a first thickness;
a second scintillating phosphor screen having a second thickness;
a substrate disposed between the first and second screens, the substrate being substantially transparent to X-rays used with the device; and
an imaging array comprising a plurality of pixels, the imaging array disposed between a first side of the substrate and one of the first and second screens, the substrate having a thickness less than two pixel pitches of the imaging array to reduce radiation scattering and light piping in the substrate, each pixel including at least one photo sensor and at least one readout element.

2. The device according to claim 1, wherein the first and second thicknesses are the same.

3. The device according to claim 1, wherein each pixel includes at least first and second photo sensors, the first photosensor being sensitive to light from the first screen and the second photo sensor being sensitive to light from the second screen.

4. The device according to claim 1 wherein the modulation transfer function (MTF) of the first screen exceeds the MTF of the second screen such that the spatial frequency at which the MTF is 50% ($f_{1/2}$) for the first screen is higher than that for the second screen by at least 0.5 c/mm; and the first screen is disposed on a second side of the substrate, opposite the first side of the substrate.

5. The device according to claim 1, wherein the X-ray absorption efficiency of the second screen exceeds that of the first screen by at least 10%.

6. The device according to claim 1, wherein the substrate is transparent to light from one or both of the first and second screens.

7. The device according to claim 1, wherein the at least one readout element comprises a thin-film transistor formed on one side of the substrate.

8. The device according to claim 1, wherein:
at least some of the photosensors of the plurality of pixels are sensitive to light from the first screen and others of the photo sensors are sensitive to light from the second screen;
the first screen comprises a first phosphor material having an element of a first atomic number;
the second screen comprises a second phosphor material having an element of a second atomic number; and
the first atomic number exceeds the second atomic number, so that the first phosphor material absorbs a higher energy component of x-ray radiation.

9. The device according to claim 8, wherein the first screen is thinner than the second screen; and, in use, the device is oriented to receive x-ray exposure that is incident from a direction of the side of the first screen.

10. A radiographic imaging device comprising:
a substrate transparent to X-rays used with the device;
a first scintillating phosphor screen having a first thickness disposed on a first side of the substrate;
a second scintillating phosphor screen having a second thickness disposed on a second side of the substrate;
the substrate being substantially transparent to light emitted from the first and second screens; and
an imaging array of pixels formed on one side of the substrate, the substrate having a thickness less than two pixel pitches of the imaging array to reduce radiation scattering and light piping in the substrate, the imaging array comprising:
a first group of photosensors provided with a first light blocking layer so as to be primarily sensitive to light emitted from the first screen; and
a second group of photosensors provided with a second light blocking layer so as to be primarily sensitive to light emitted from the second screen.

11. The device according to claim 10, wherein the X-ray absorption efficiency of the second screen exceeds that of the first screen by at least 10%.

12. The device according to claim 10 wherein the second group of photosensors and the first group of photosensors are formed in separate planes.

13. The device according to claim 12, further comprising an opaque material separating the first and second groups of photosensors.

14. The device according to claim 12, wherein the thickness of one of the first group and the second group of photosensors exceeds one optical absorption length for at least a portion of the electromagnetic spectrum.

15. The device according to claim 14, further comprising an array of readout elements in communication with the first and second groups of photosensors.

16. The device according to claim 14, in which the readout element array is fabricated in a first plane; the first group of photosensors is fabricated in the first plane; and the second group of photosensors is disposed in a second plane that is parallel to the first plane and lies outside the first plane.

17. The device according to claim 14, wherein the first and second group of photosensors and the readout elements are formed in the same plane.

18. The device according to claim 14, wherein the first and second group of photosensors are formed in a first plane and the readout elements are formed in a second plane lying outside the first plane.

19. The device according to claim 10, wherein the first and second group of photosensors are formed in the same plane.

20. The device according to claim 10, wherein the substrate is formed on the second scintillating phosphor screen.

21. The device according to claim 10, further comprising a light-absorbing colorant or light-scattering particles diffused essentially uniformly in the substrate to reduce light scattering along the substrate.

22. The device according to claim 10, further comprising a light-absorbing colorant layer applied to surfaces of the substrate to reduce light scattering along the substrate.

23. The device according to claim 10, further comprising a light-absorbing colorant diffused into surface layers of the substrate to reduce light scattering along the substrate.

24. A radiographic imaging device comprising:
a first scintillating phosphor screen having a first thickness;
a second scintillating phosphor screen having a second thickness;
a substrate disposed between the first and second screens, the substrate being substantially transparent to X-rays used with the device;
an imaging array disposed between a first side of the substrate and one of the first and second screens, the imaging array comprising a plurality of pixels, each pixel including at least one photosensor and at least one readout element, the substrate having a thickness less than two pixel pitches of the imaging array to reduce radiation scattering and light piping in the substrate, and wherein the modulation transfer function (MTF) of the first screen exceeds the MTF of the second screen such that the spatial frequency at which the MTF is 50% ($f_{1/2}$) for the first screen is higher than that for the second screen by at least 0.5 c/mm; and the first screen is disposed on a second side of the substrate, opposite the first side of the substrate.

25. A radiographic imaging device comprising:

a first scintillating phosphor screen having a first thickness;

a second scintillating phosphor screen having a second thickness;

a substrate disposed between the first and second screens, the substrate being substantially transparent to X-rays used with the device; and an imaging array comprising a plurality of pixels, the imaging array disposed between a first side of the substrate and one of the first and second screens, each pixel including at least first and second photosensors and at least one readout element per photosensor, the first photosensor being provided with a first light blocking layer so as to be sensitive to light from the first screen.

26. The radiographic imaging device of claim 25, further comprising where the second photosensor is provided with a second light blocking layer so as to be sensitive to light from the second screen.

* * * * *